United States Patent
Oohashi et al.

(10) Patent No.: US 7,023,310 B2
(45) Date of Patent: Apr. 4, 2006

(54) METHOD FOR MANUFACTURING MAGNETIC SENSOR, MAGNET ARRAY USED IN THE METHOD, AND METHOD FOR MANUFACTURING THE MAGNET ARRAY

(75) Inventors: Toshiyuki Oohashi, Hamamatsu (JP); Kokichi Aiso, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 11/076,069

(22) Filed: Mar. 10, 2005

(65) Prior Publication Data

US 2005/0200449 A1    Sep. 15, 2005

(30) Foreign Application Priority Data

Mar. 12, 2004    (JP)    ............... 2004-070927

(51) Int. Cl.
*H01H 7/02* (2006.01)
*G11B 5/127* (2006.01)

(52) U.S. Cl. .................. 335/306; 29/592.1; 29/603.01; 360/324; 360/324.1; 360/324.11

(58) Field of Classification Search ............ 329/592.1, 329/603.01–603.27; 360/313–324.2; 335/285–306
See application file for complete search history.

(56) References Cited

U.S. PATENT DOCUMENTS

| | | | |
|---|---|---|---|
| 5,561,368 | A | 10/1996 | Dovek |
| 5,945,825 | A | 8/1999 | Clemens |
| 6,465,053 | B1 | 10/2002 | Lenssen et al. |
| 2002/0006017 | A1 | 1/2002 | Adelerhof |
| 2002/0142490 | A1 | 10/2002 | Sato et al. |
| 2004/0080872 | A1 | 4/2004 | Sato et al. |
| 2004/0130323 | A1 | 7/2004 | Oohashi et al. |

FOREIGN PATENT DOCUMENTS

| | | |
|---|---|---|
| DE | 196 49 265 A1 | 6/1998 |
| DE | 197 42 366 C1 | 5/1999 |
| EP | 0 905 523 A2 | 3/1999 |
| JP | 04-218982 | 8/1992 |
| JP | 05-126577 A1 | 5/1993 |

(Continued)

OTHER PUBLICATIONS

Honeywell Sensor Products: 1- and 2-Axis Magnetic Sensors HMC1001/1002, HMC1021/1022 Product Specification.

(Continued)

*Primary Examiner*—Ramon M. Barrera
(74) *Attorney, Agent, or Firm*—Dickstein, Shapiro, Morin & Oshinsky, LLP.

(57) ABSTRACT

A magnetic sensor includes eight SAF-type GMR elements. Four of the GMR elements detect a magnetic field in the direction of the X-axis and are bridge-connected to thereby constitute an X-axis magnetic sensor. The other four GMR elements detect a magnetic field in the direction of the Y-axis and are bridge-connected to thereby constitute a Y-axis magnetic sensor. The magnetization of a pinned layer of each of the GMR elements is pinned in a fixed direction by means of a magnetic field that a permanent bar magnet inserted into a square portion of a yoke of a magnet array generates in the vicinity of a rectangular portion of the yoke. A magnetic field generated in the vicinity of a certain rectangular portion of the yoke differs in direction by 90 degrees from a magnetic field generated in the vicinity of a rectangular portion adjacent to the former rectangular portion.

8 Claims, 35 Drawing Sheets

FOREIGN PATENT DOCUMENTS

| | | |
|---|---|---|
| JP | 05-218982 | 8/1993 |
| JP | 10-070325 | 3/1998 |
| JP | 2786601 | 5/1998 |
| JP | 2000-035470 A1 | 2/2000 |
| JP | 2000-338211 A1 | 12/2000 |
| JP | 2001-013231 A1 | 1/2001 |
| JP | 2001-099903 A1 | 4/2001 |

OTHER PUBLICATIONS

Siemens Magnetic Sensors Application Notes; Oct. 1998.

Wanjun Ku, et al; "Precision X-Y Robotic Object Handling Using A Dual GMR Bridge Sensor"; IEEE Transactions on Magnetics; vol. 36(5); Sep. 2000; pp. 2782-2784.

W.C. Black, Jr., et al.; "High-speed circuits employing on-chip magnetics compounds"; Mixed-Signal Design; 1999; SSMSD '99; pp. 156-161.

Hill et al., Sensors and Actuators A, vol. 59, pp. 30-37 (1997).

Ron Neale, "Taming the Giant MagnetoResistance (GMR) effect", Sensors, Electronic Engineering, pp. 36-40 (1996).

Smith et al., "The Growing Role of Solid-State Magnetic Sensing", Sensors Expo-Detroit, pp.139-149 (1997).

Spong et al., "Giant Magnetoresistive Spin Valve Bridge Sensor", IEEE Transactions on Magnetics, vol. 32, No. 2, pp. 366-371 (1996).

Daughton et al., "Magnetic Field Sensors Using GMR Multilayer", IEEE Transactions on Magnetics, vol. 30, No. 5, pp. 4608-4610 (1994).

US 7,023,310 B2

METHOD FOR MANUFACTURING MAGNETIC SENSOR, MAGNET ARRAY USED IN THE METHOD, AND METHOD FOR MANUFACTURING THE MAGNET ARRAY

BACKGROUND OF THE INVENTION

1. Field of the Invention

The present invention relates to a method for manufacturing a magnetic sensor using a magnetoresistance element (so-called synthetic spin valve film) having a multifilm laminated fixed layer, to a magnet array suited for use in the method, and to a method for manufacturing the magnet array.

2. Description of the Related Art

A conventionally known giant magnetoresistance element (hereinafter referred to as a "GMR element") includes a fixed layer that includes a pinned layer, and a pinning layer for pinning the magnetization of the pinned layer in a fixed direction; a free layer whose magnetization direction varies in accordance with an external magnetic field; and a spacer layer disposed between the pinned layer and the free layer and made of a nonmagnetic electric conductor. The resistance of the GMR element varies in accordance with the angle between the magnetization direction of the pinned layer and the magnetization direction of the free layer. In other words, the resistance of the GMR element varies in accordance with a component of the external magnetic field aligned with the magnetization direction of the pinned layer. Therefore, the magnetic detection direction of the GMR element coincides with the magnetization direction of the pinned layer.

The GMR element is used in magnetic sensors, such as a terrestrial magnetism sensor. In such an application, even when the GMR element is exposed to a strong magnetic field or high temperature, its fixed layer must exhibit stable magnetization. If the magnetization of the fixed layer varies, the resistance characteristic of the GMR element will vary. In order to meet the requirement, there has been developed a GMR element (so-called synthetic spin valve film) in which the conventional fixed layer is replaced with a multifilm laminated fixed layer.

A pinned layer of the multifilm laminated fixed layer includes a first ferromagnetic film adjacent to a spacer layer; a second ferromagnetic film laminated on the first ferromagnetic film; and an exchange-coupling film sandwiched between the first ferromagnetic film and the second ferromagnetic film. A pinning layer of the multifilm laminated fixed layer is made of antiferromagnet and is laminated on the second ferromagnetic layer. The pinning layer is exchange-coupled to the second ferromagnetic layer to thereby pin the magnetization of the second ferromagnetic film in a fixed direction. The first ferromagnetic film and the second ferromagnetic film are exchange-coupled to each other via the exchange-coupling film, whereby the magnetization of the first ferromagnetic film is pinned in a fixed direction (e.g., refer to Japanese Patent No. 2786601 (paragraphs 0016 to 0024 and FIG. 5)).

Meanwhile, a magnetic sensor (e.g., terrestrial magnetism sensor) that utilizes a GMR element and is adapted to detect the direction of an external magnetic field requires at least two GMR elements of different magnetic detection directions. The direction of the external magnetic field coincides with the direction of a resultant vector of two vectors of the magnetic field, which two vectors are detected by the two GMR elements, respectively, and aligned with the magnetic detection directions of the two GMR elements, respectively. Such a magnetic sensor is called a biaxial magnetic sensor.

In order to pin the magnetization of a pinned layer of a synthetic spin valve film, a step in which an element film is held at high temperature for a predetermined period of time while a very strong magnetic field is applied thereto (heat treatment process) must be performed. Accordingly, in order to reduce the size of a biaxial magnetic sensor, which uses two GMR elements whose synthetic spin valve films are of different magnetic detection directions, two strong magnetic fields whose directions differ from each other (e.g., the directions are perpendicular to each other) must be generated at close positions. However, generation of such magnetic fields is very difficult. As a result, a small-sized biaxial magnetic sensor using a synthetic spin valve film has encountered difficulty in mass production.

SUMMARY OF THE INVENTION

An object of the present invention is to provide a method for manufacturing a magnetic sensor which enables mass production of small-sized biaxial magnetic sensors using a synthetic spin valve film, a magnet array suited for use in the method, and a method for manufacturing the magnet array.

A manufacturing method of the present invention is adapted to manufacture a magnetic sensor that uses a giant magnetoresistance element (GMR element) having a synthetic spin valve film. The GMR element comprises a fixed layer including a pinned layer, and a pinning layer for pinning the magnetization of the pinned layer in a fixed direction; a free layer whose magnetization direction varies in accordance with an external magnetic field; and a spacer layer disposed between the pinned layer and the free layer and made of a nonmagnetic electric conductor.

The fixed layer is a multifilm laminated fixed layer configured such that:

the pinned layer comprises a first ferromagnetic film adjacent to the spacer layer, a second ferromagnetic film laminated on the first ferromagnetic film, and an exchange-coupling film sandwiched between the first ferromagnetic film and the second ferromagnetic film;

the pinning layer comprises an exchange bias film made of antiferromagnet, disposed adjacent to the second ferromagnetic film on a side opposite the exchange-coupling film, and adapted to pin the magnetization of the second ferromagnetic film in a fixed direction through exchange-coupling with the second ferromagnetic film; and the first ferromagnetic film and the second ferromagnetic film are exchange-coupled to each other via the exchange-coupling film.

In the magnetic sensor manufactured by the method of the present invention, at least two such GMR elements are disposed on a substrate, and magnetization directions of the pinned layers of the GMR elements are substantially perpendicular to each other.

The method of the present invention for manufacturing the thus-configured magnetic sensor comprises the steps of:

(1) preparing a magnet array;

(2) manufacturing a wafer having element films which are to become the GMR elements; and (3) pinning the magnetizations of films which are to become the fixed layers, in respectively fixed directions.

(1) The step of preparing a magnet array is performed in the following manner:

a magnet array comprising a plurality of permanent magnets and a thin-plate yoke made of a magnetic material is prepared, each permanent magnet having the shape of a substantially rectangular parallelepiped, the rectangular parallelepiped having a cross section in a substantially square shape taken perpendicular to its axis, and each permanent magnet having magnetic poles generated on its corresponding opposite end surfaces having the substantially square shape perpendicular to the axis;

the plurality of permanent magnets are arranged in such a manner that the centroid of each of the substantially square end surfaces thereof coincides with a lattice point of a tetragonal lattice, that the permanent magnets arranged on the same lattice line of the tetragonal lattice are such that one side of the end surface of a certain permanent magnet is substantially aligned with one side of the end surface of another permanent magnet, that the end surfaces of the plurality of permanent magnets are present substantially on the same plane, and that magnetic poles generated on the end surfaces of two adjacent, closest permanent magnets differ in polarity; and the yoke has a plurality of through holes arranged in substantially the same manner as the arranged permanent magnets, each through hole comprising a square portion having a shape substantially identical with the substantially square cross section of the permanent magnet, and rectangular portions each being formed along a central portion of a side of the square portion (square) and having the central portion as its long side; the plurality of permanent magnets are inserted through the corresponding square portions of the plurality of through holes; and a plane in which the end surfaces of the plurality of permanent magnets are present is located between an upper surface and a lower surface of the yoke.

When the magnet array is viewed in plane, a rightward magnetic field is generated from a certain N-pole toward an S-pole located on the right side of the N-pole; an upward magnetic field is generated from the N-pole toward an S-pole located on the upper side of the N-pole; a leftward magnetic field is generated from the N-pole toward an S-pole located on the left side of the N-pole; and a downward magnetic field is generated from the N-pole toward an S-pole located on the lower side of the N-pole. Similarly, a leftward magnetic field is generated toward a certain S-pole from an N-pole located on the right side of the S-pole; a downward magnetic field is generated toward the S-pole from an N-pole located on the upper side of the S-pole; a rightward magnetic field is generated toward the S-pole from an N-pole located on the left side of the S-pole; and an upward magnetic field is generated toward the S-pole from an N-pole located on the lower side of the S-pole. Lines of magnetic force associated with the magnetic fields pass along the yoke, through the rectangular portions of the yoke, and along the vicinity of the rectangular portions. Accordingly, mutually orthogonal, very strong magnetic fields are generated at the adjacent rectangular portions of the yoke and at portions immediately above the rectangular portions.

(2) The step of manufacturing a wafer having element films which are to become the GMR elements is performed in the following manner:

there is manufactured a wafer in which element films each including a film to become the fixed layer, a film to become the spacer layer, and a film to become the free layer are formed on the substrate.

In this case, the wafer may be manufactured as follows: at least two island-like element films, each including the film to become the fixed layer, the film to become the spacer layer, and the film to become the free layer, are disposed on the substrate; and as viewed in plane, the at least two element films are formed such that, while one element film is disposed at a position corresponding to (i.e., disposed inside of) a certain rectangular portion formed along a certain side of a certain square portion of the magnet array, the other element film is disposed at a position corresponding to (i.e., disposed inside of) another rectangular portion formed along a side of the square portion adjacent to the former side of the square portion.

(3) The step of pinning the magnetizations of films which are to become the fixed layers, in respectively fixed directions, is performed in the following manner:

the wafer on which the element films are formed is disposed in the proximity of the magnet array in such a manner that the plane of the wafer is in parallel with the plane of the yoke, to thereby apply magnetic fields generated in the vicinity of (at and/or around) the rectangular portions of the yoke to the wafer, and is held at high temperature, whereby pinning of magnetization in a fixed direction is performed simultaneously with respect to the films to become the fixed layers.

In the case where at least two island-like element films are formed on the wafer, by means of disposing the wafer in the proximity of the magnet array such that, as viewed in plane, while one element film is disposed at a position corresponding to (i.e., disposed inside of) a certain rectangular portion formed along a certain side of a certain square portion of the magnet array, the other element film is disposed at a position corresponding to (i.e., disposed inside of) another rectangular portion formed along a side of the square portion adjacent to the former side of the square portion, magnetic fields generated in the vicinity of (at and/or around) the rectangular portions of the magnet array are applied to the element films. The element films are held at high temperature, whereby the magnetizations of the films to become the fixed layers of the element films are simultaneously pinned in respectively fixed directions.

As mentioned previously, mutually orthogonal, very strong magnetic fields are generated at the adjacent rectangular portions of the yoke of the magnet array and at portions in the vicinity of (immediately above) the rectangular portions. Accordingly, the strong magnetic fields are applied to two adjacent element films, so that magnetization of the pinned layers of the synthetic spin valve films of the element films can be reliably pinned. Also, there can be formed a biaxial magnetic sensor in which at least two GMR elements are disposed very close to each other on the same substrate and in which magnetization directions of pinned layers of synthetic spin valve films of the GMR elements are perpendicular to each other. Furthermore, by use of the above-described magnet array, pinning of magnetization can be performed simultaneously (in the same heat treatment process) with respect to pinned layers of a plurality of element films formed on a single wafer so as to yield two or more (a large number of) biaxial magnetic sensors. Thus, a biaxial magnetic sensor can be manufactured at low cost.

A magnet array according to the present invention is used in the above-described method for manufacturing a magnetic sensor. Preferably, in the yoke of the magnet array as viewed in plane, openings are formed at positions where centroids of squares formed by connecting lattice points of the tetragonal lattice are located within the corresponding openings (i.e., each of openings is formed to surround a centroid of square formed by connecting adjacent lattice points of the tetragonal lattice). The openings may be substantially circular.

The positions where the openings are formed are where lines of magnetic force extending (or generating) from magnetic poles of permanent magnets intersect, with resultant instability in magnetic fields. Forming the openings at such positions prevents intersection of lines of magnetic force, thereby eliminating instability in magnetic fields. Thus, a stable, strong, uniform magnetic field can be locally generated in each of the rectangular portions of the yoke. As a result, use of the magnet array allows, for example, effective pinning of magnetization for the film that is to become the fixed layer, and effective magnetization of a bias magnet film of a magnetic sensor.

Preferably, as viewed in plane, each of the through holes of the yoke has marginal portions which have a substantially circular arc shape and are formed at corresponding corners of the square portion of the through hole in such a manner as to expand outward.

In the case where square through holes are formed in a yoke by, for example, etching, insufficient etching causes the square through holes to have round corners, potentially resulting in a problem that permanent magnets cannot be inserted through the corresponding through holes. By contrast, in manufacture of the above-described yoke, the marginal portions are also etched, so that permanent magnets can be reliably inserted through the corresponding through holes.

The above-mentioned magnet array comprises an array substrate formed of a thin plate, a plurality of permanent magnets arrayed on the array substrate, and a yoke disposed at upper portions of the plurality of permanent magnets and formed of a thin plate of a magnetic material. The magnet array can be manufactured by a method comprising the steps of:

preparing the array substrate by means of forming a plurality of grooves in the thin plate in a predetermined tetragonal lattice array, each of the grooves having a predetermined depth and a square shape substantially identical in shape with the end face of the permanent magnet;

preparing the yoke by means of forming a plurality of through holes in the thin plate of the magnetic material in the predetermined tetragonal lattice array, each of the through holes comprising a square portion having a square shape substantially identical in shape with the groove of the array substrate and rectangular portions each being formed along a central portion of a side of the square portion and having the central portion as its long side;

arranging each of prism-like (prismatic) spacers on the array substrate between two adjacent parallel lines of the grooves;

placing the yoke on the spacers in such a manner that, as viewed in plane, the plurality of grooves of the array substrate are aligned with the corresponding through holes of the yoke;

inserting the plurality of permanent magnets each having the shape of a substantially rectangular parallelepiped, the rectangular parallelepiped having a cross section in a square shape (a cross section of a square shape) taken perpendicular to its axis, the square shape being substantially identical in shape with the groove of the array substrate and with the square portion of the through hole of the yoke, each permanent magnet having magnetic poles generated on its corresponding opposite end surfaces having the square shape, into the corresponding grooves of the array substrate through the corresponding through holes of the yoke in such a manner that lower end surfaces of the permanent magnets abut corresponding bottom surfaces of the grooves;

raising the yoke until a plane in which upper end surfaces of the permanent magnets are present is positioned between upper and lower surfaces of the yoke; and removing the spacers.

Preferably, the step of preparing the yoke includes a step of forming openings in the thin plate at positions where, as viewed in plane, centroids of squares formed by connecting lattice points of the tetragonal lattice are located.

Preferably, in the step of raising the yoke, the yoke is raised by means of holding the yoke at the openings with a tool.

BRIEF DESCRIPTION OF THE DRAWINGS

Various other objects, features and many of the attendant advantages of the present invention will be readily appreciated as the same becomes better understood by reference to the following detailed description of the preferred embodiment when considered in connection with the accompanying drawings, in which.

DESCRIPTION OF THE PREFERRED EMBODIMENTS

Embodiments of the present invention will next be described in detail with reference to the drawings. An embodiment of a magnetic sensor according to the present invention will be first described. The magnetic sensor is classified into an N-type magnetic sensor 10 shown in FIG. 1 and an S-type magnetic sensor 30 shown in FIG. 2. The N-type and S-type magnetic sensors 10 and 30 are manufactured by manufacturing methods to be described later.

Figure 1:
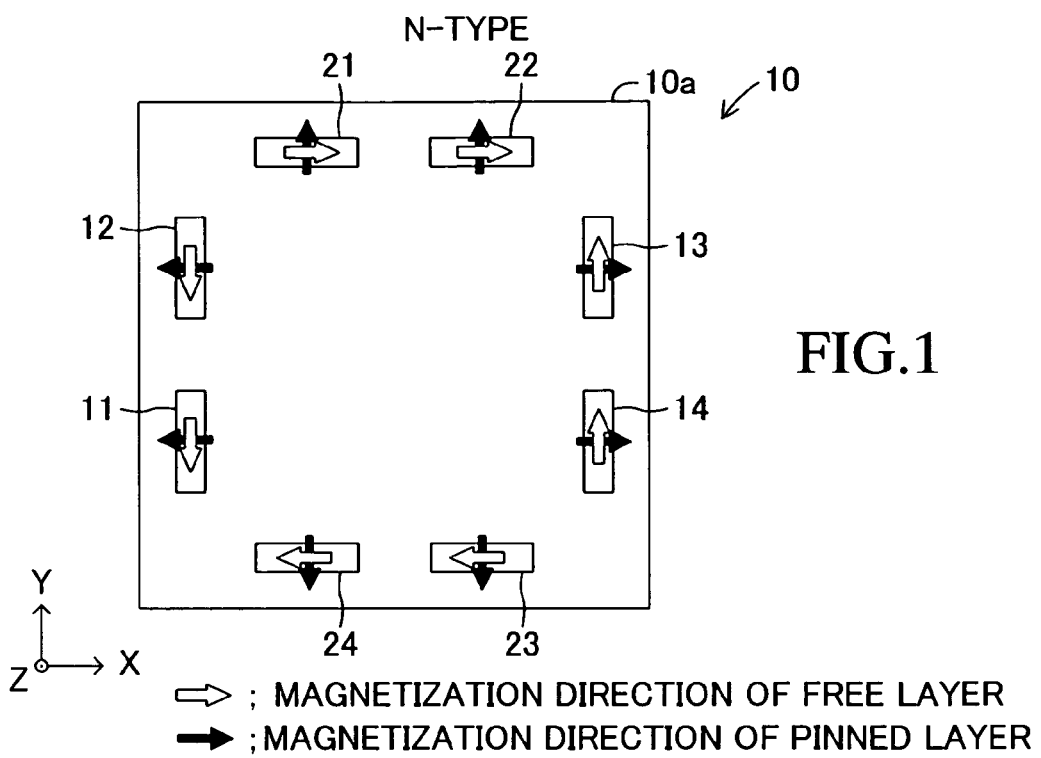
FIG. 1 is a plan view showing an embodiment of a magnetic sensor (N-type) according to the present invention.
Figure 2:
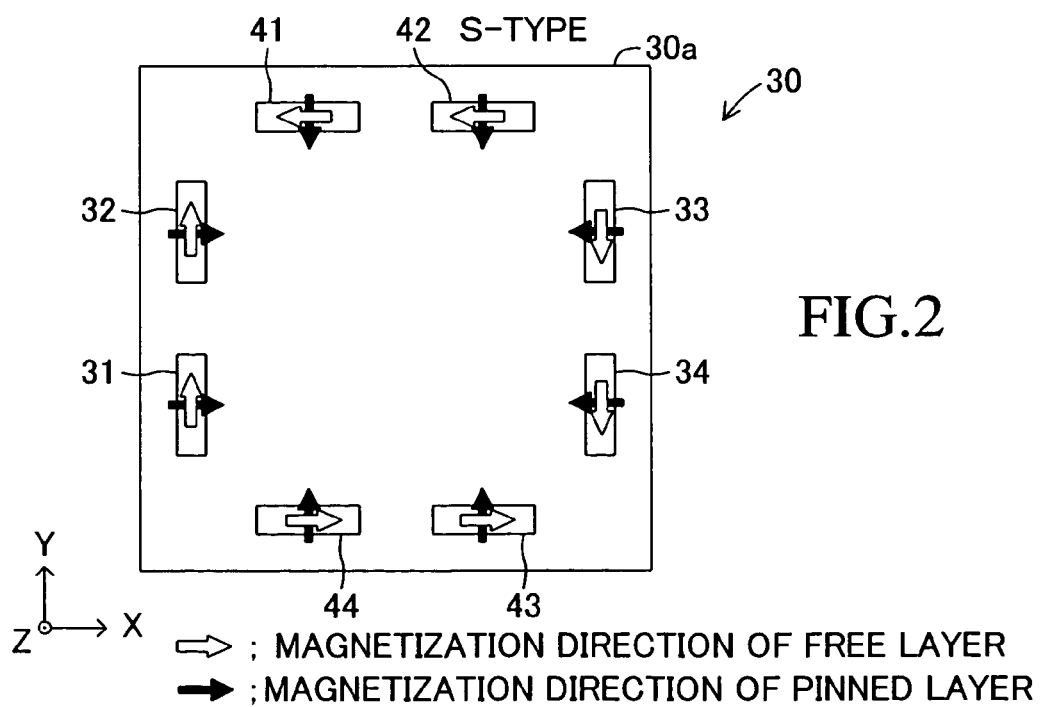
FIG. 2 is a plan view showing an embodiment of another magnetic sensor (S-type) according to the present invention.

The N-type magnetic sensor 10 and the S-type magnetic sensor 30 assume substantially the same shape and configuration except for the fixed magnetization direction of a pinned layer as represented by the black solid arrow of FIGS. 1 and 2 and the magnetization direction of a free layer in an initial state (a state in which an external magnetic field is absent) as represented by the inline arrow of FIGS. 1 and 2. Therefore, the N-type magnetic sensor 10 will be mainly discussed below.

As shown in FIG. 1, the magnetic sensor 10 includes a single substrate (monolithic chip) 10*a* and eight GMR elements 11 to 14 and 21 to 24 formed on (or above, over) the substrate 10*a*. The substrate 10*a* is made of quartz glass.

The substrate 10a is a thin plate that, as viewed in plane, assumes a rectangular shape (substantially square shape) having sides extending along mutually orthogonal X-axis and Y-axis and that has a small thickness along a Z-axis perpendicular to the X- and Y-axes.

The GMR elements 11 to 14 and 21 to 24 have substantially the same structure, except for arrangement on the substrate 10a. Therefore, the structure of the first X-axis GMR element 11 will be representatively described.

Figure 3A:
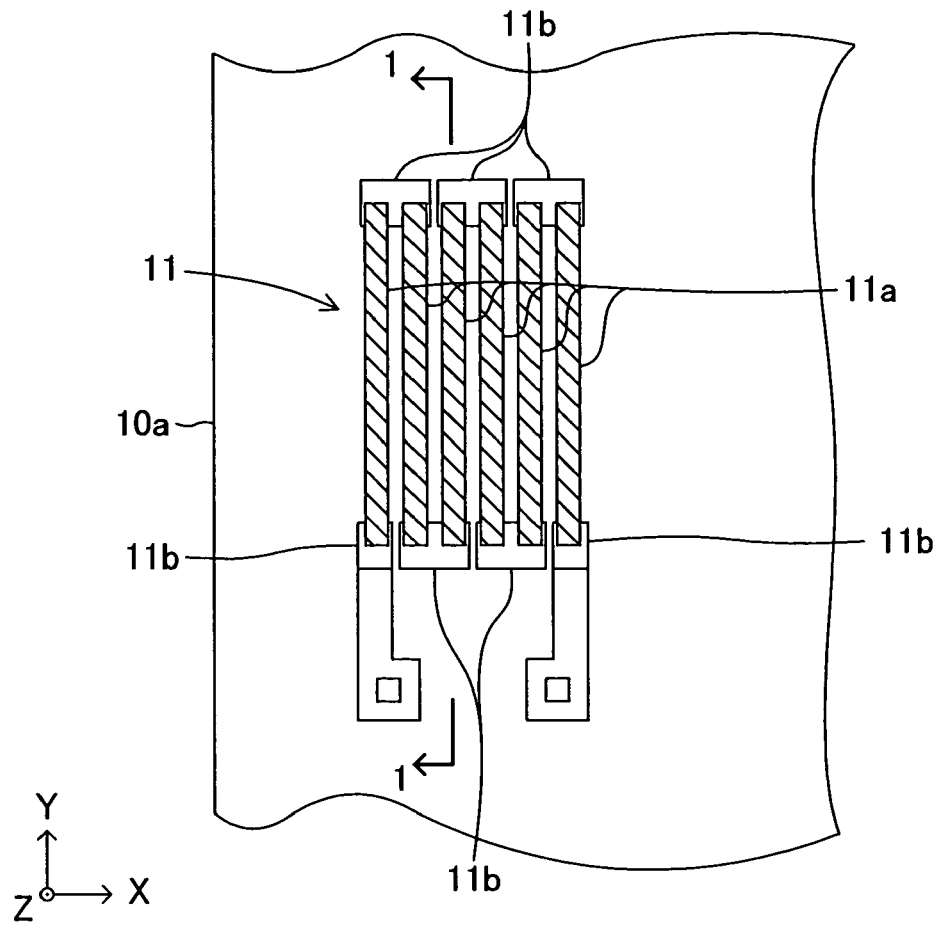
FIG. 3A is an enlarged schematic plan view showing a first X-axis GMR element shown in FIG. 1.
Figure 3B:
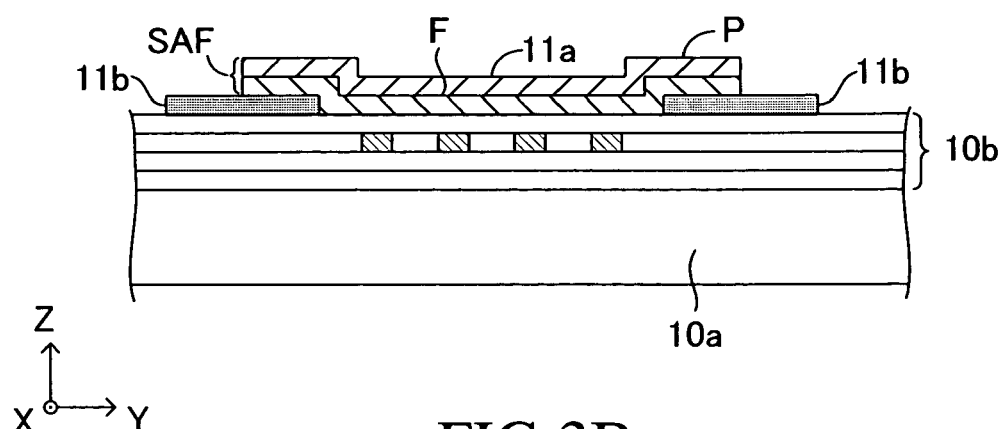
FIG. 3B is a schematic sectional view of the first X-axis GMR element taken along line 1—1 of FIG. 3A.

As shown in FIG. 3A, which is a plan view of the first X-axis GMR element 11, and FIG. 3B, which is a schematic sectional view of the first X-axis GMR element 11 taken along line 1—1 of FIG. 3A, the first X-axis GMR element 11 includes a plurality of narrow strip portions 11a extending in the Y-axis and a plurality of bias magnet films 11b formed under longitudinally opposite end portions (opposite end portions with respect to the Y-axis) of the narrow strip portions 11a.

The narrow strip portions 11a are formed of a synthetic spin valve film SAF, which constitutes a magnetoresistance element having a multifilm laminated fixed layer. The bias magnet films 11b are made of a hard ferromagnetic material, such as CoCrPt, having high coercive force and high remanence ratio and are magnetized to become permanent magnet films. The narrow strip portions 11a are magnetically coupled to the bias magnet films 11b at the upper surfaces of the bias magnet films 11b.

Figure 4:
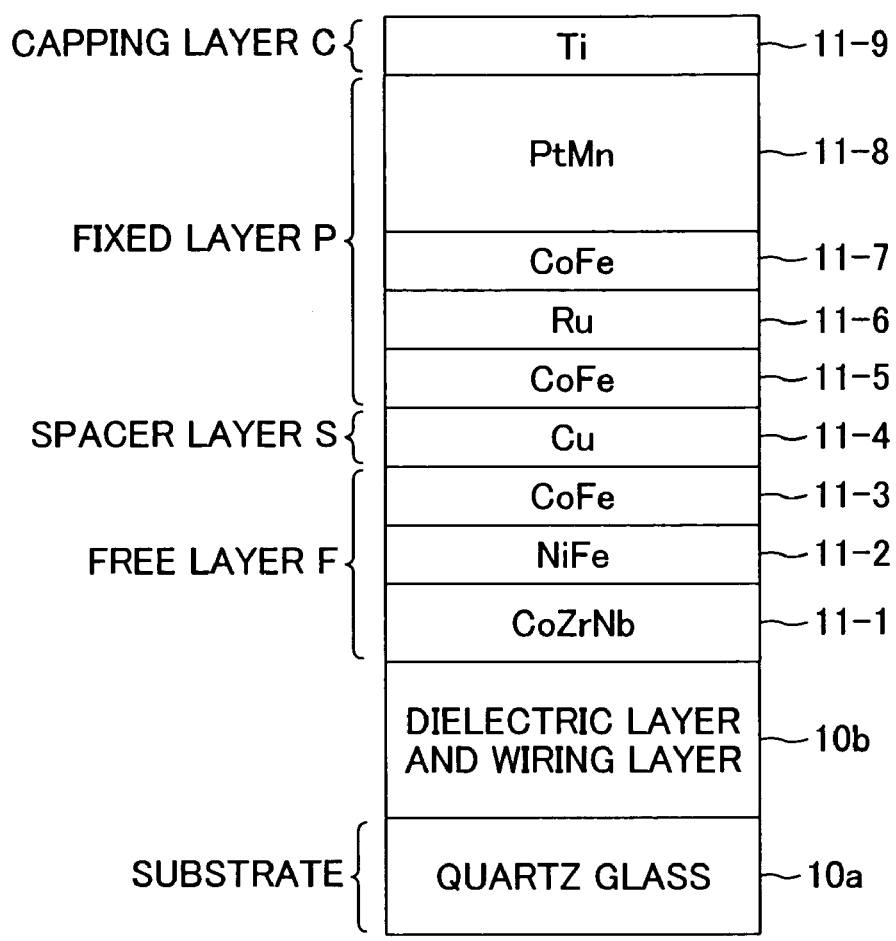
FIG. 4 is a view showing the film configuration (configuration of synthetic spin valve film SAF) of the first X-axis GMR element shown in FIG. 3.

The synthetic spin valve film SAF of the first X-axis GMR element 11 is shown in FIG. 4. The synthetic spin valve film SAF of the first X-axis GMR element 11 includes a dielectric layer 10b (including a wiring layer(s)) formed on the substrate 10a; a free layer F formed on the dielectric layer 10b; a spacer layer S formed on the free layer F; a fixed layer P formed on the spacer layer S; and a capping layer C formed on the fixed layer P. Elements for the magnetic sensor 10, such as transistors and memories etc., are formed in or on the substrate 10a. Wiring layers are included in the dielectric layer 10b. The wiring layers connect the elements, pads and the GMR elements etc., to form the sensor 10. The pads connect the magnetic sensor 10 with external equipment via Au wires bonded to the upper surfaces of the pads. The wiring layers may be called conductor lines. The substrate 10a and the dielectric layer 10b, taken together, may be called a "substrate," since the GMR elements 11 to 14 and 21 to 24 are formed thereon.

The magnetization direction of the free layer F varies in accordance with the direction of an external magnetic field. The free layer F includes a CoZrNb amorphous magnetic layer 11-1 formed on the substrate (dielectric layer 10b) and having a thickness of 8 nm (80 angstroms); an NiFe magnetic layer 11-2 formed on the CoZrNb amorphous magnetic layer 11-1 and having a thickness of 3.3 nm (33 angstroms); and a CoFe layer 11-3 formed on the NiFe magnetic layer 11-2 and having a thickness of about 1 nm to 3 nm (10 angstroms to 30 angstroms). The CoZrNb amorphous magnetic layer 11-1 and the NiFe magnetic layer 11-2 constitute a soft ferromagnetic film. The CoFe layer 11-3 prevents diffusion of Ni from the NiFe layer 11-2 and diffusion of Cu from a Cu layer 11-4 of the spacer layer S.

The spacer layer S is an electrically conductive film made of Cu and having a thickness of 2.4 nm (24 angstroms).

The fixed layer (magnetization-fixed layer or pin layer) P includes a first ferromagnetic film 11-5 made of CoFe and having a thickness of 2.5 nm (25 angstroms); an exchange-coupling film 11-6 laminated on the first ferromagnetic film 11-5, made of Ru, and having a thickness of 0.8 nm to 0.9 nm (8 angstroms to 9 angstroms); a second ferromagnetic film 11-7 laminated on the exchange-coupling film 11-6, made of CoFe, and having a thickness of 2.2 nm (22 angstroms); and an exchange bias film (antiferromagnetic film) 11-8 laminated on the second ferromagnetic film 11-7, having a thickness of 24 nm (240 angstroms), and made of a PtMn alloy that contains Pt in an amount of 45 mol % to 55 mol %.

As mentioned above, the exchange-coupling film 11-6 is sandwiched between the first ferromagnetic film 11-5 and the second ferromagnetic film 11-7. The first ferromagnetic film 11-5, the exchange-coupling film 11-6, and the second ferromagnetic film 11-7 constitute a pinned layer whose magnetization is pinned in a fixed direction so that the magnetization direction does not vary with a variation in an external magnetic field. The exchange bias film 11-8 is a pinning layer for pinning the magnetization of the pinned layer in a fixed direction.

When an element in which the films 11-5 to 11-8 are laminated undergoes ordering heat treatment (a heat treatment process) in which a predetermined strong magnetic field is applied to the element at a predetermined high temperature for a predetermined period of time, the exchange bias film 11-8 is exchange-coupled to the second ferromagnetic film 11-7, thereby pinning the magnetization (magnetization vector) of the second ferromagnetic film 11-7 in a fixed direction. The first ferromagnetic film 11-5 and the second ferromagnetic film 11-7 are exchange-coupled to each other via the exchange-coupling film 11-6. As a result, the magnetization of the first ferromagnetic film 11-5 is pinned in a fixed direction. Notably, the magnetization direction of the first ferromagnetic film 11-5 and the magnetization direction of the second ferromagnetic film 11-7 are antiparallel with each other. For example, in FIG. 1, when ordering heat treatment is performed while the direction of a magnetic field is set to the positive direction of the X-axis, the magnetization of the first ferromagnetic film 11-5 of the first X-axis GMR element 11 is pinned in the negative direction of the X-axis. The magnetization direction of the first ferromagnetic film 11-5 is a direction in which the magnetization of the pinned layer of the first X-axis GMR element is pinned.

The capping layer C has a thickness of 1.5 nm (15 angstroms) and is made of titanium (Ti) or tantalum (Ta).

The bias magnet films 11b shown in FIGS. 3A and 3B apply a bias magnetic field to the free layer F in a longitudinal direction of the free layer F in order to maintain uniaxial anisotropy of the free layer F. In the first X-axis GMR element 11, the bias magnet films 11b apply a bias magnetic field in the negative direction of the Y-axis.

Figure 5:
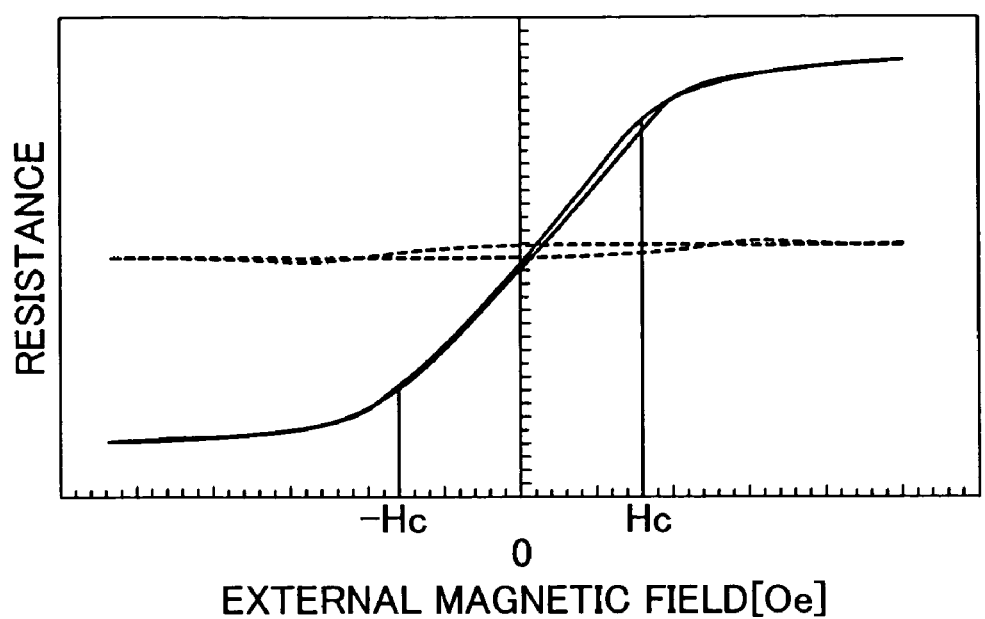
FIG. 5 is a graph showing a variation in resistance of the first X-axis GMR element shown in FIG. 1 as represented by the solid line in the presence of a magnetic field that varies in the direction of the X-axis, and a variation in the resistance as represented by the broken line in the presence of a magnetic field that varies in the direction of the Y-axis.

The thus-configured first X-axis GMR element 11 exhibits the following characteristics. As represented by the solid line in FIG. 5, in the presence of an external magnetic field that varies along the X-axis, the resistance of the first X-axis GMR element 11 varies substantially in proportion to the external magnetic field within the range of −Hc to +Hc. As represented by the broken line in FIG. 5, the resistance of the first X-axis GMR is substantially constant in the presence of an external magnetic field that varies along the Y-axis. In other words, the first X-axis GMR element 11 detects a magnetic field in the direction in which the magnetization of the pinned layer is pinned.

The first X-axis GMR element 11 is formed on the substrate 10a at a position located on a side toward the negative direction of the Y-axis with respect to a central portion of the substrate 10a and in the vicinity of an edge portion of the substrate 10a with respect to the negative direction of the X-axis. As mentioned above, the magnetization of the pinned layer of the first X-axis GMR element 11 is pinned in the negative direction of the X-axis. The second X-axis GMR element 12 is formed on the substrate 10$a$ at a position located on a side toward the positive direction of the Y-axis with respect to a central portion of the substrate 10$a$ and in the vicinity of an edge portion of the substrate 10$a$ with respect to the negative direction of the X-axis; and the magnetization of the pinned layer of the second X-axis GMR element 12 is pinned in the negative direction of the X-axis. The third X-axis GMR element 13 is formed on the substrate 10$a$ at a position located on a side toward the positive direction of the Y-axis with respect to a central portion of the substrate 10$a$ and in the vicinity of an edge portion of the substrate 10$a$ with respect to the positive direction of the X-axis; and the magnetization of the pinned layer of the third X-axis GMR element 13 is pinned in the positive direction of the X-axis. The fourth X-axis GMR element 14 is formed on the substrate 10$a$ at a position located on a side toward the negative direction of the Y-axis with respect to a central portion of the substrate 10$a$ and in the vicinity of an edge portion of the substrate 10$a$ with respect to the positive direction of the X-axis; and the magnetization of the pinned layer of the fourth X-axis GMR element 14 is pinned in the positive direction of the X-axis.

The first Y-axis GMR element 21 is formed on the substrate 10$a$ at a position located on a side toward the negative direction of the X-axis with respect to a central portion of the substrate 10$a$ and in the vicinity of an edge portion of the substrate 10$a$ with respect to the positive direction of the Y-axis; and the magnetization of the pinned layer of the first Y-axis GMR element 21 is pinned in the positive direction of the Y-axis. The second Y-axis GMR element 22 is formed on the substrate 10$a$ at a position located on a side toward the positive direction of the X-axis with respect to a central portion of the substrate 10$a$ and in the vicinity of an edge portion of the substrate 10$a$ with respect to the positive direction of the Y-axis; and the magnetization of the pinned layer of the second Y-axis GMR element 22 is pinned in the positive direction of the Y-axis. The third Y-axis GMR element 23 is formed on the substrate 10$a$ at a position located on a side toward the positive direction of the X-axis with respect to a central portion of the substrate 10$a$ and in the vicinity of an edge portion of the substrate 10$a$ with respect to the negative direction of the Y-axis; and the magnetization of the pinned layer of the third Y-axis GMR element 23 is pinned in the negative direction of the Y-axis. The fourth Y-axis GMR element 24 is formed on the substrate 10$a$ at a position located on a side toward the negative direction of the X-axis with respect to a central portion of the substrate 10$a$ and in the vicinity of an edge portion of the substrate 10$a$ with respect to the negative direction of the Y-axis; and the magnetization of the pinned layer of the fourth Y-axis GMR element 24 is pinned in the negative direction of the Y-axis.

Next, an X-axis magnetic sensor (magnetic sensor for detecting a magnetic field in the X-direction) including the GMR elements 11 to 14, and a Y-axis magnetic sensor (magnetic sensor for detecting a magnetic field in the Y-direction) including the GMR elements 21 to 24, will be described.

Figure 6A:
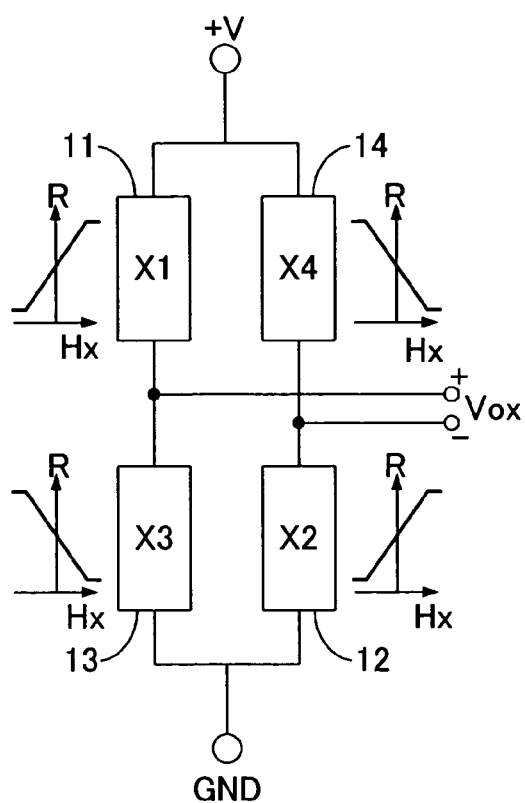
FIG. 6A is an equivalent circuit diagram of an X-axis magnetic sensor included in the magnetic sensor shown in FIG. 1.

As shown in the equivalent circuit of FIG. 6A, the X-axis magnetic sensor is configured by full bridge connection of the first to fourth X-axis GMR elements 11 to 14 via unillustrated conductors. In FIG. 6A, graphs which accompany the first to fourth X-axis GMR elements 11 to 14, respectively, show characteristics (variation in resistance R with external magnetic field) of the GMR elements adjacent thereto. Hx appearing in the graphs represent an external magnetic field whose intensity varies along the X-axis (X-axis component of an external magnetic field).

Figure 6B:
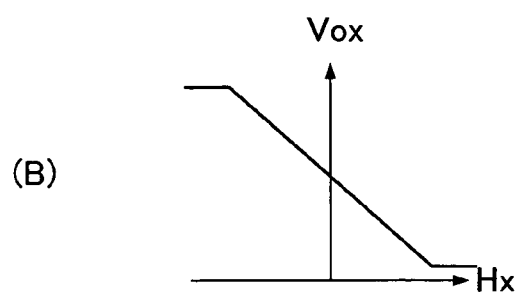
FIG. 6B is a graph showing a variation in output of the X-axis magnetic sensor of FIG. 6A in the presence of a magnetic field that varies in the direction of the X-axis.

In the above-mentioned configuration, the connection point of the first X-axis GMR element 11 and the fourth X-axis GMR element 14 and the connection point of the second X-axis GMR element 12 and the third X-axis GMR element 13 are connected to the positive pole and the negative pole (ground), respectively, of an unillustrated constant-voltage source, whereby the potential +V (5 V in the present embodiment) and the potential −V (0 V in the present embodiment) are applied to the respective connection points. The potential difference $V_{Ox}$ between the connection point of the first X-axis GMR element 11 and the third X-axis GMR element 13 and the connection point of the fourth X-axis GMR element 14 and the second X-axis GMR element 12 is obtained as a sensor output. As a result, as shown in FIG. 6B, the X-axis magnetic sensor outputs the voltage $V_{Ox}$, which is substantially in proportion to an external magnetic field Hx that varies along the X-axis and which decreases as the external magnetic field Hx increases.

The Y-axis magnetic sensor is configured by full bridge connection of the first to fourth Y-axis GMR elements 21 to 24 via unillustrated conductors. The Y-axis magnetic sensor outputs the voltage $V_{Oy}$, which is substantially in proportion to an external magnetic field Hy that varies along the Y-axis and which decreases as the external magnetic field Hy increases. The N-type magnetic sensor 10 is configured as described above.

Meanwhile, as shown in FIG. 2, the S-type magnetic sensor 30 includes GMR elements 31 to 34 and 41 to 44. The magnetic sensor 30 is configured in a manner similar to the magnetic sensor 10 and is composed of an X-axis magnetic sensor and a Y-axis magnetic sensor.

Specifically, the X-axis magnetic sensor of the magnetic sensor 30 is configured by full bridge connection of the first to fourth X-axis GMR elements 31 to 34 via unillustrated conductors. The X-axis magnetic sensor of the magnetic sensor 30 outputs a voltage $V_{Ox}$, which is substantially in proportion to the external magnetic field Hx and which increases as the external magnetic field Hx increases. The Y-axis magnetic sensor of the magnetic sensor 30 is configured by full bridge connection of the first to fourth Y-axis GMR elements 41 to 44 via unillustrated conductors. The Y-axis magnetic sensor of the magnetic sensor 30 outputs a voltage $V_{Oy}$, which is substantially in proportion to the external magnetic field Hy and which increases as the external magnetic field Hy increases.

Figure 7:
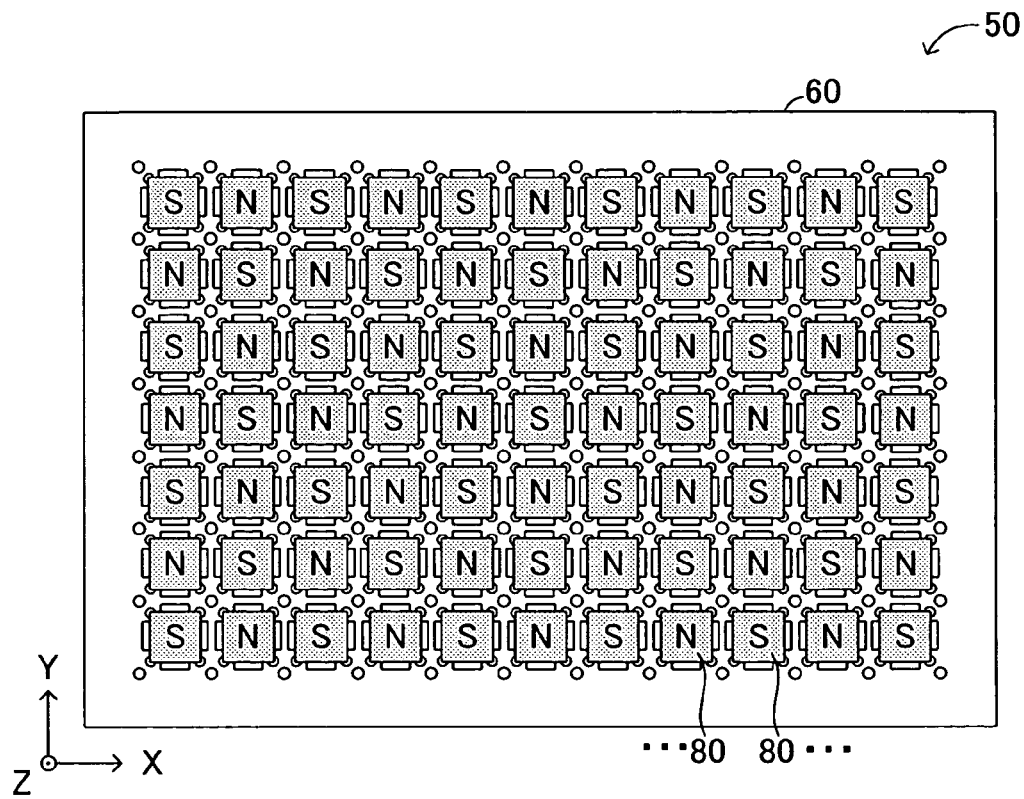
FIG. 7 is a plan view showing a magnet array used for pinning the magnetization directions of pinned layers of the magnetic sensors shown in FIGS. 1 and 2.
Figure 8:
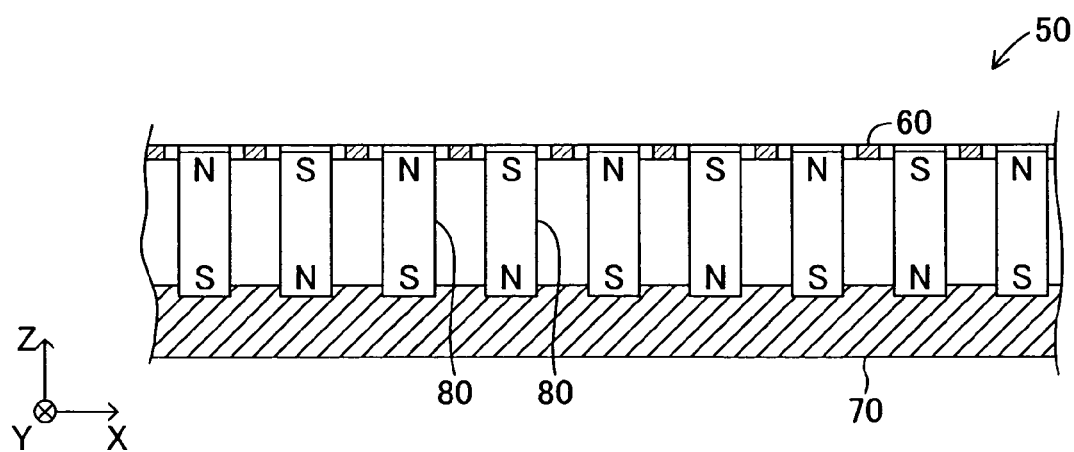
FIG. 8 is a partial, sectional view showing the magnet array of FIG. 7.

Next, an embodiment of a magnet array 50 according to the present invention will be described. The magnet array 50 is used for pinning the magnetizations of pinned layers of the fixed layers P of the magnetic sensors 10 and 30 in respectively fixed directions. As shown in FIGS. 7 and 8, the magnet array 50 includes a yoke (yoke plate) 60, an array substrate 70, and a plurality of permanent magnets (permanent bar magnets) 80.

Figure 9:
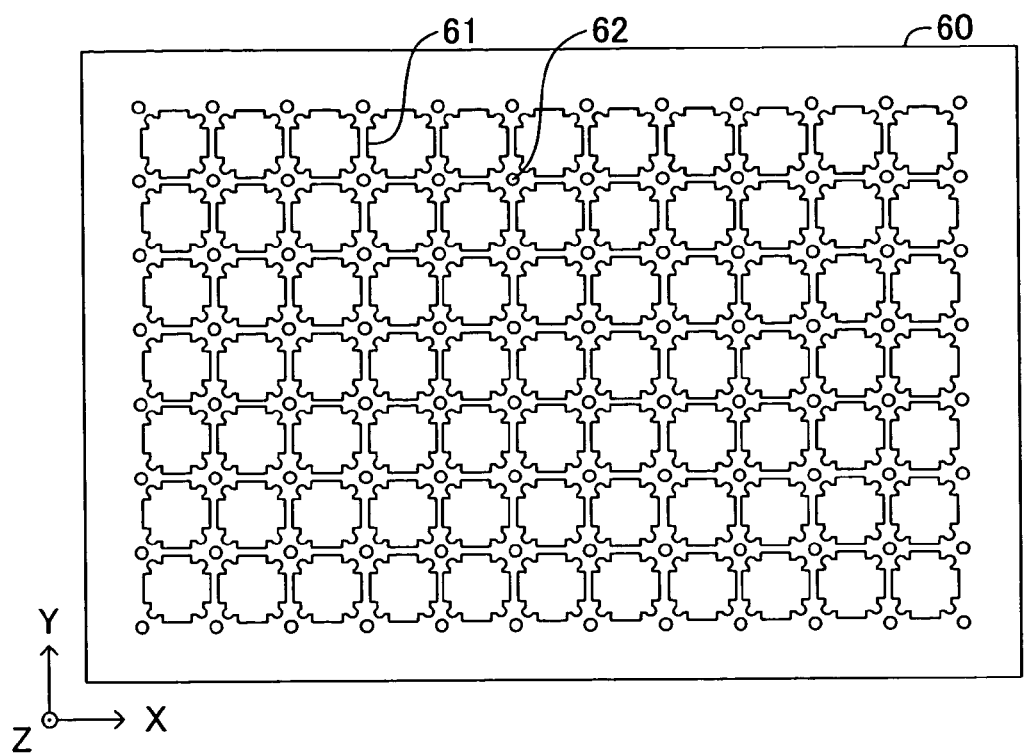
FIG. 9 is a plan view showing a yoke of the magnet array of FIG. 7.
Figure 10:
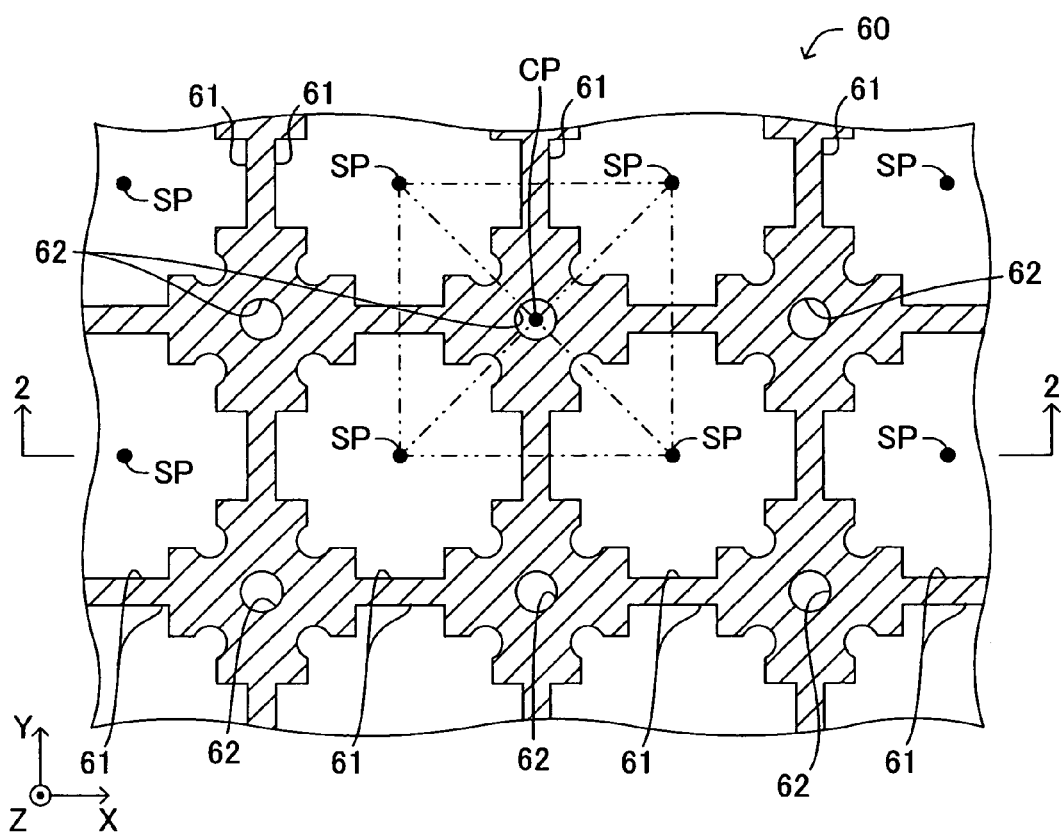
FIG. 10 is an enlarged partial plan view showing the yoke of FIG. 9.
Figure 11:
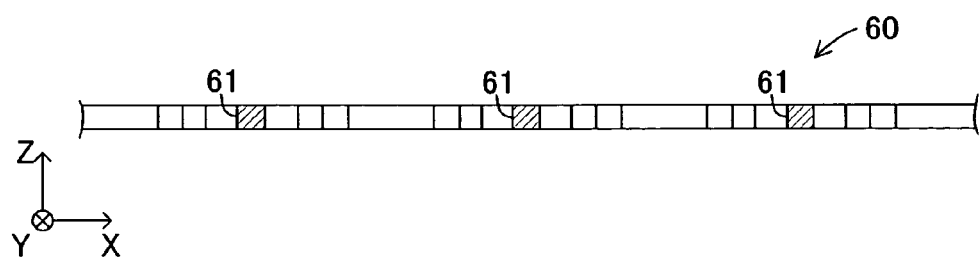
FIG. 11 is a sectional view of the yoke taken along line 2—2 of FIG. 10.

The yoke 60 is shown in FIGS. 9 to 11. FIG. 9 is a plan view of the yoke 60; FIG. 10 is an enlarged partial view of FIG. 9; and FIG. 11 is a sectional view of the yoke 60 taken along line 2—2 of FIG. 10. The yoke 60 is a thin plate member made of a magnetic material having a magnetic permeability higher than that of the air, such as 42 alloy (Fe-42 Ni alloy which contains Ni in an amount of 42 wt. %). The yoke 60 may be made of a high-saturation, high-magnetic-permeability material, such as Permalloy or silicon steel (sheet).

Figure 12:
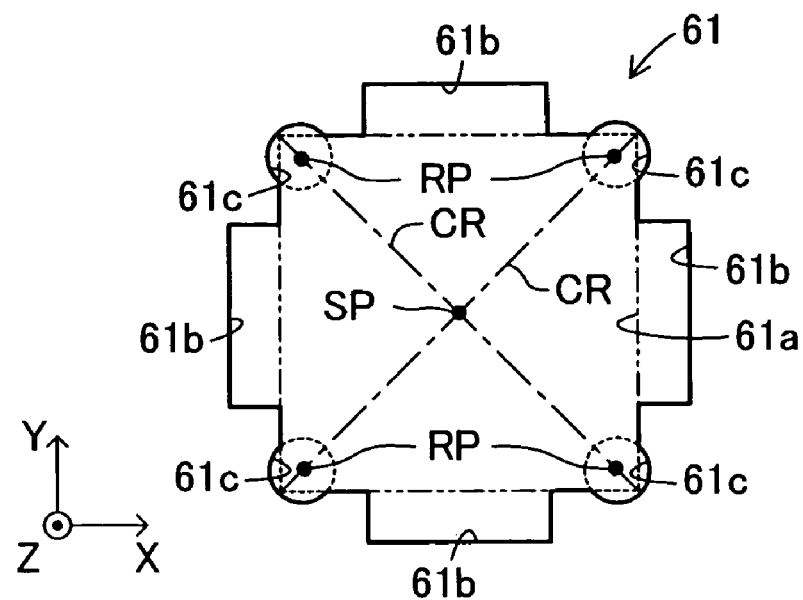
FIG. 12 is a plan view showing a through hole formed in the yoke of FIG. 9.

The yoke 60 assumes a rectangular shape as viewed in plane. In the present embodiment, the yoke 60 has a thickness of 0.15 mm. The yoke 60 includes a plurality of through holes 61 and a plurality of openings (magnetic-flux control holes) 62. As shown in the enlarged view of FIG. 12, each of the through holes 61 includes a single square portion 61a, four rectangular portions 61b, and four marginal portions (circular arc portions or R portions) 61c.

The square portion 61a has a square shape as viewed in plane. Each of the rectangular portions 61b has a rectangular shape that is formed along a central portion of a side of the square portion 61a in such a manner as to expand to the exterior of the square portion 61a and has the central portion as its long side (i.e., the central portion forms one long side of the rectangular shape). Each of the marginal portions 61c expands to the exterior of the square portion 61a from a corresponding corner portion of the square portion 61a. More specifically, each of the marginal portions 61c assumes the shape of a circular arc whose center RP is located on a diagonal line CR of the square portion 61a.

The plurality of through holes 61 are arranged in a tetragonal lattice array. In other words, the centroid of each through hole 61 (centroid of each square portion 61a) coincides with a lattice point SP of the tetragonal lattice shown in FIG. 10. One side of the square portion 61a of a certain through hole 61 is in parallel with one side of the square portion 61a of an adjacent through hole 61. One side of the square portion 61a of a certain through hole 61 is aligned with one side of the square portion 61a of another through hole 61 formed in the same column or row as the certain through hole 61. Similarly, one side of the rectangular portion 61b of a certain through hole 61 is aligned with one side of the rectangular portion 61b of another through hole 61 formed in the same column or row as the certain through hole 61.

The openings 62 are formed at positions where centroids CP of squares formed by connecting lattice points SP of the tetragonal lattice are located within the corresponding opening 62. That is, each of openings 62 is formed to surround a centroid CP of square formed by connecting adjacent lattice points SP of the tetragonal lattice. More specifically, as viewed in plane, each of the openings 62 is a circular through hole whose center is located at the centroid CP.

Figure 13:
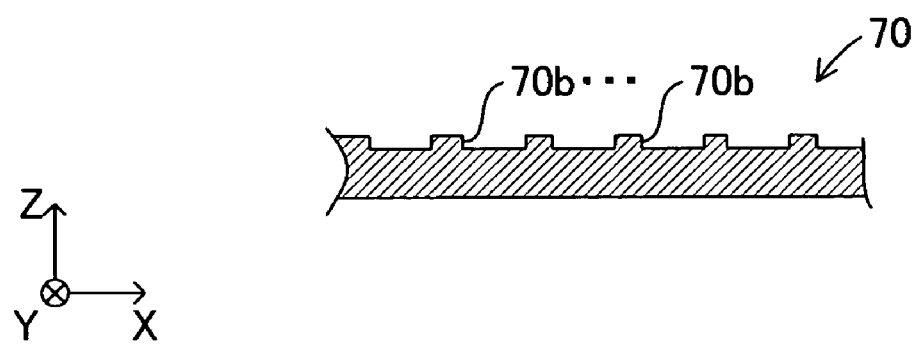
FIG. 13 is a partial, sectional view showing an array substrate of the magnet array of FIG. 7.
Figure 14:
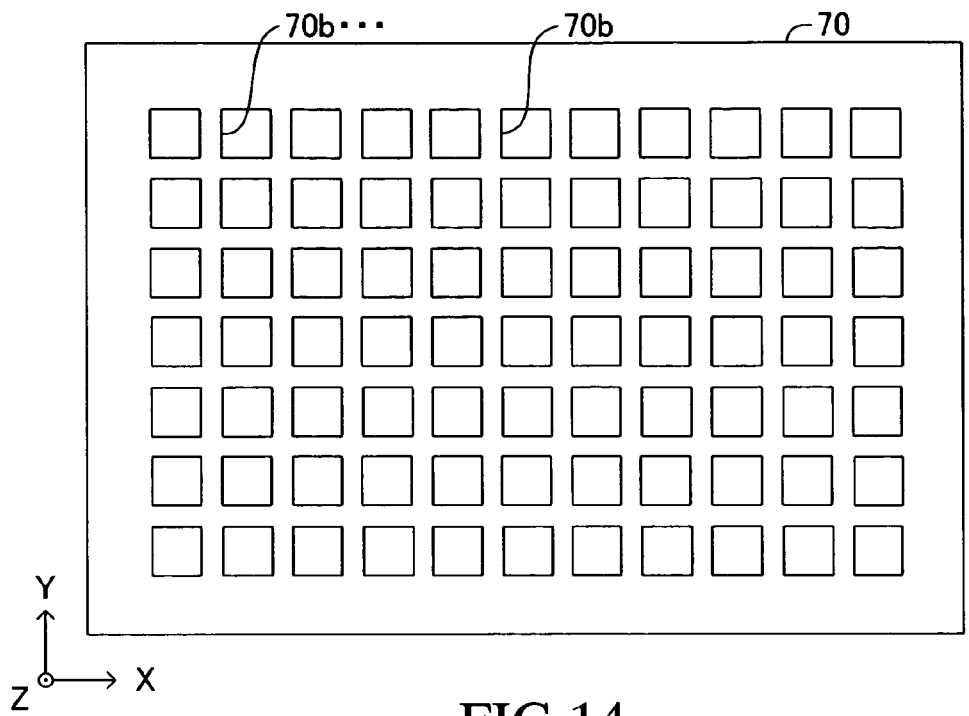
FIG. 14 is a plan view showing the array substrate of the magnet array of FIG. 7.
Figure 15:
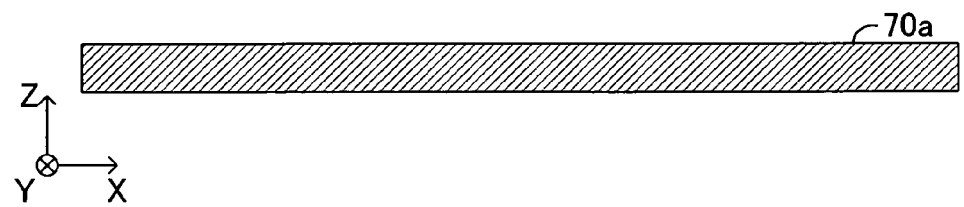
FIG. 15 is a sectional view showing a thin plate used to form the array substrate of FIG. 13.

The array substrate 70 shown in FIGS. 13 and 14 is formed from a thin plate 70a of a magnetic material (e.g., Permalloy such as 42 alloy) shown in FIG. 15. As viewed in plane, the array substrate 70 has a rectangular shape substantially identical in shape with the yoke 60. The array substrate 70 includes a plurality of grooves 70b. As viewed in plane, the plurality of grooves 70b are located at the same positions as the corresponding square portions 61a of the through holes 61 of the yoke 60. Each of the grooves 70b has a square shape substantially identical in shape with the square portion 61a of the through hole 61.

Each of the permanent bar magnets 80 assumes the shape of a rectangular parallelepiped. The cross section of the rectangular parallelepiped cut by a plane perpendicular to one center axis of the rectangular parallelepiped (e.g., relatively longer axis of the rectangular parallelepiped) has a square shape substantially identical in shape with the square portion 61a of the through hole 61 and with the groove 70b of the array substrate 70. Each of the permanent bar magnets 80 has magnetic poles generated in the vicinity of its corresponding opposite end surfaces, which have the square shape. The plurality of permanent bar magnets 80 have substantially the same magnetic charge. The permanent bar magnets 80 are inserted into the corresponding grooves 70b of the array substrate 70 and through the corresponding square portions 61a of the yoke 60 to thereby be held in place. The permanent bar magnets 80 are arranged such that two adjacent, closest permanent bar magnets 80 differ in polarity between magnetic poles generated on their end surfaces (i.e., the magnetic poles generated on the end surfaces of two adjacent, closest permanent magnets differ in polarity.).

The above description of the magnet array 50 can be summarized as follows. The magnet array 50 includes a plurality of permanent bar magnets 80 and a thin-plate yoke 60 made of a magnetic material. Each permanent bar magnet 80 has the shape of a substantially rectangular parallelepiped. The rectangular parallelepiped has a cross section in a substantially square shape taken perpendicular to its axis. Each permanent bar magnet 80 has magnetic poles generated on its corresponding opposite end surfaces having the substantially square shape perpendicular to the axis.

The plurality of permanent bar magnets 80 are arranged in such a manner that the centroid of each of substantially square end surfaces thereof coincides with a lattice point SP of a tetragonal lattice and that the permanent bar magnets 80 arranged on the same lattice line of the tetragonal lattice are such that one side of the end surface of a certain permanent bar magnet 80 is substantially aligned with one side of the end surface of another permanent bar magnet 80. Furthermore, the plurality of permanent bar magnets 80 are arranged in such a manner that the end surfaces thereof are present substantially on the same plane and that magnetic poles generated on the end surfaces of two adjacent, closest permanent bar magnets 80 differ in polarity.

The yoke 60 has a plurality of through holes 61 arranged in substantially the same manner as the arranged permanent bar magnets 80. Each through hole 61 includes a square portion 61a having a shape substantially identical with the substantially square shape of the cross section of the permanent bar magnet 80, and rectangular portions 61b each being formed along a central portion of a side of the square portion 61a and having the central portion as its long side. The plurality of permanent bar magnets 80 are inserted through the corresponding square portions 61a of the plurality of through holes 61. A plane in which the end surfaces of the permanent bar magnets 80 are present is located between the upper surface and the lower surface of the yoke 60.

Next, a method for manufacturing the magnet array 50 will be described. First, a plate used to form the yoke 60 is prepared. Etching is performed on the plate to thereby form the through holes 61 and the openings 62. Next, the thin plate 70a (see FIG. 15) used to form the array substrate 70 is prepared. Etching (half etching) is performed on the thin plate 70a to thereby form the grooves 70b (see FIGS. 13 and 14).

Figure 16:
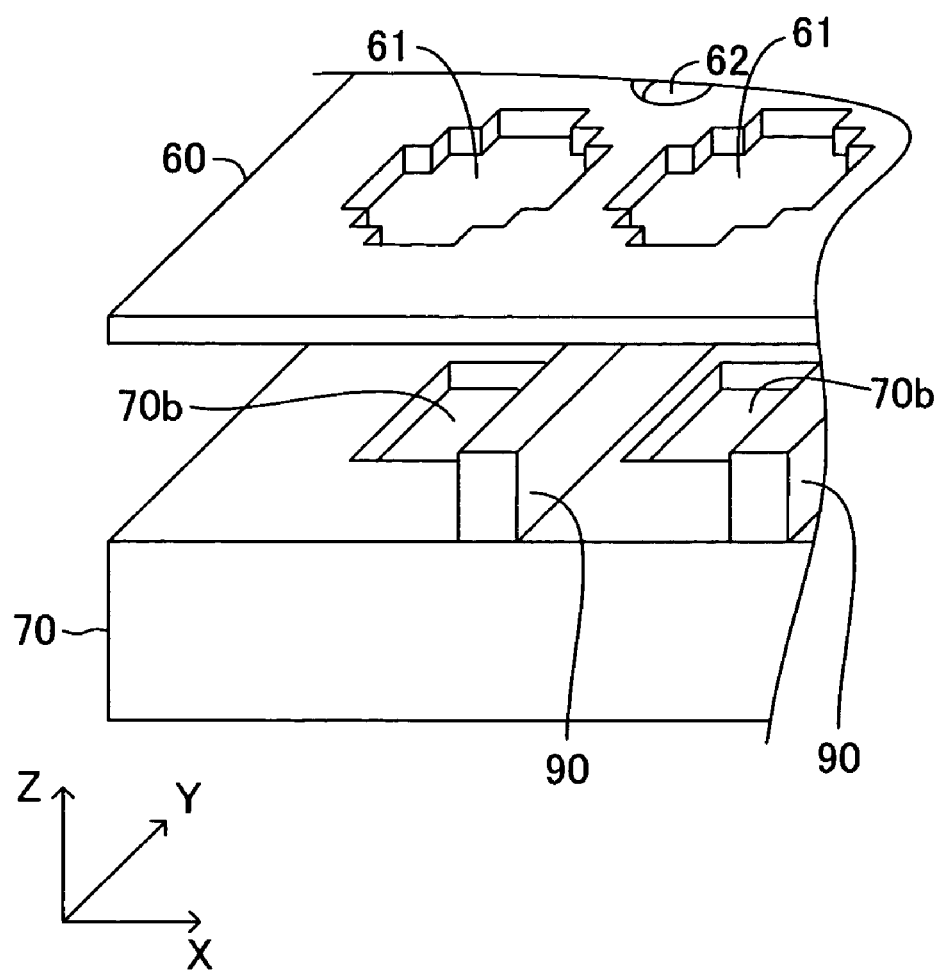
FIG. 16 is a view showing a step in manufacture of the magnet array of FIG. 7.
Figure 17:
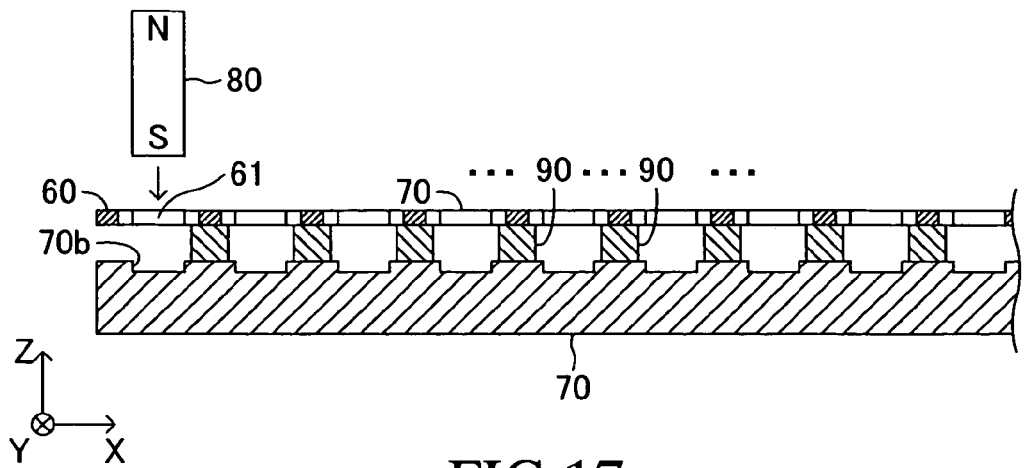
FIG. 17 is a view showing another step in manufacture of the magnet array of FIG. 7.

Next, as shown in the perspective view of FIG. 16 and the sectional view of FIG. 17, prism-like (prismatic) spacers 90 made of glass are arranged on the array substrate 70. Each of the spacers 90 is disposed on the array substrate 70 between two adjacent parallel lines of the grooves 70b. In the thus-disposed spacer 90, the length of the spacer 90 in the Z-axis is shorter than the length between the opposite end surfaces of the permanent bar magnet 80, on which magnetic poles are formed.

Subsequently, the yoke 60 is placed on the spacers 90. In this case, the yoke 60 is disposed in such a manner that, as viewed in plane, the grooves 70b of the array substrate 70 are aligned with the corresponding square portions 61a of the through holes 61 of the yoke 60. In order to facilitate the disposing work, a positioning mark (alignment mark) may be provided on the yoke 60 and on the array substrate 70. Note that, in FIG. 16, the marginal portions 61c are omitted.

Next, as shown in FIG. 17, the permanent bar magnets 80 are inserted through the corresponding through holes 61. The inserting work is performed in such a manner that the polarized first-side end surfaces of the permanent bar magnets 80 abut the corresponding bottom surfaces of the grooves 70b of the array substrate 70. As a result, the polarized second-side end surfaces (hereinafter may be referred as "upper surfaces" for convenience sake) of the permanent bar magnets 80 are present in substantially the same plane (on the same plane). Furthermore, the permanent bar magnets 80 are arranged such that the magnetic poles generated on the end surfaces of two adjacent, closest permanent magnets 80 differ in polarity, as viewed in the plane that includes the upper surfaces of the permanent bar magnets 80.

Figure 18:
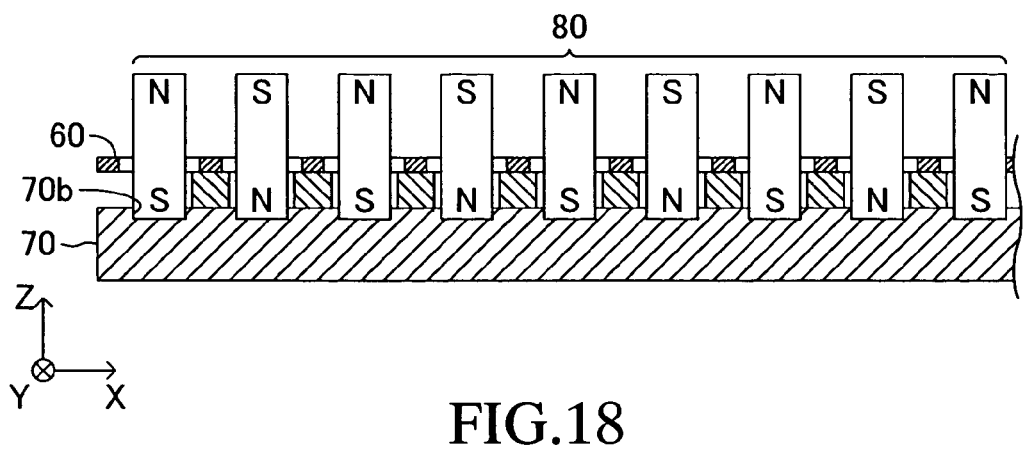
FIG. 18 is a view showing another step in manufacture of the magnet array of FIG. 7.

As a result, the permanent bar magnets 80 are arranged as shown in FIG. 18. In this state, movement of the permanent bar magnets 80 in the X- and Y-axis directions is prevented, since the permanent bar magnets 80 are inserted into the grooves 70b and the square portions 61a of the through holes 61 of the yoke 60.

Next, the yoke 60 is raised (in the positive direction of the Z-axis) by means of utilizing the openings 62. Specifically, the yoke 60 is raised while being held at the two openings 62 by use of tweezers. This raising work is repeatedly performed by utilizing other openings 62 so as to gradually raise the entire yoke 60.

Figure 19:
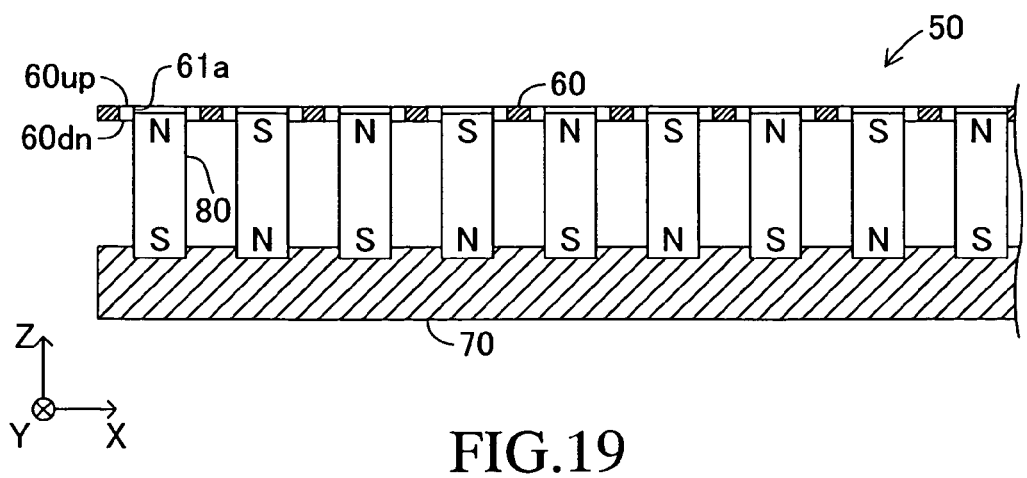
FIG. 19 is a view showing another step in manufacture of the magnet array of FIG. 7.

As shown in FIG. 19, the height of the yoke 60 (the distance between the array substrate 70 and the yoke 60) is adjusted in such a manner that a plane defined by the upper surfaces of the permanent bar magnets 80 (the polarized second-side end surfaces of the permanent bar magnets 80) is located between an upper surface 60up and a lower surface 60dn of the yoke 60. In other words, the yoke 60 is raised such that the upper surfaces of the permanent bar magnets 80 are located within the range of the thickness of the yoke 60. Notably, the upper surface 60up of the yoke 60 and the plane defined by the upper surfaces of the permanent bar magnets 80 may be present in the same plane. Subsequently, the spacers 90 are removed, and the yoke 60 is fixed in relation to the array substrate 70. Thus is completed the magnet array 50.

Figure 20:
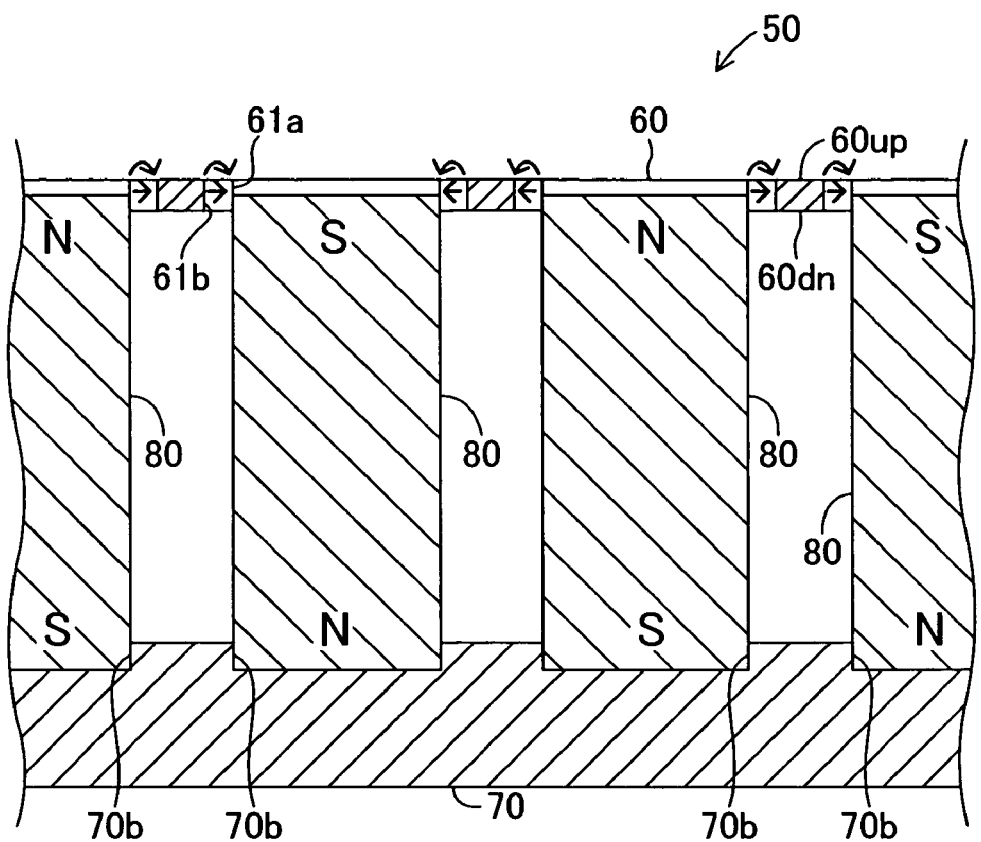
FIG. 20 is a partial, sectional view showing the magnet array of FIG. 7 for the purpose of explaining magnetic fields generated by the magnet array.
Figure 21:
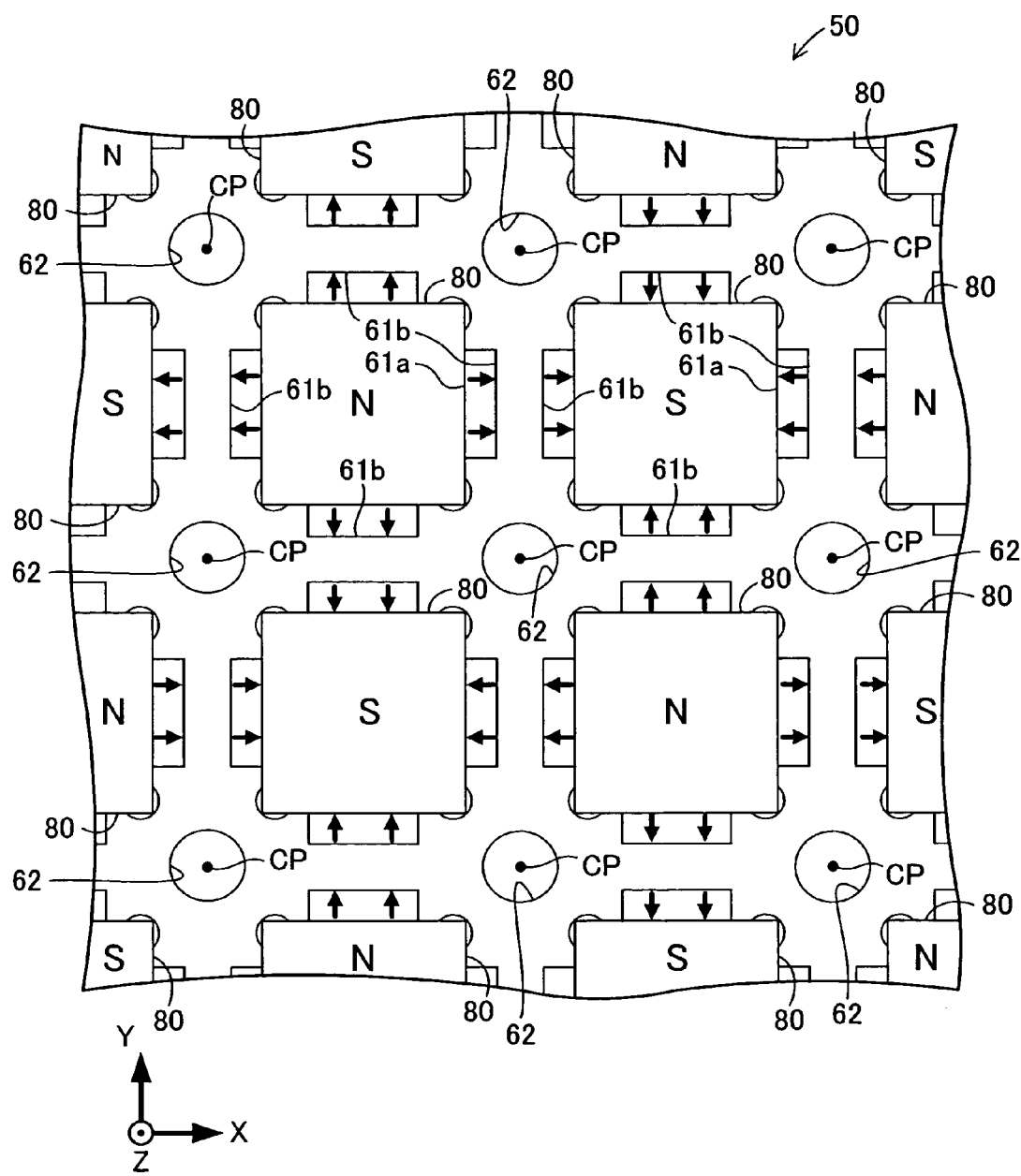
FIG. 21 is a plan view showing the magnet array of FIG. 7 for the purpose of explaining magnetic fields generated by the magnet array.

As shown in the partially enlarged sectional view of FIG. 20 and the partially enlarged plan view of FIG. 21, in the thus-manufactured magnet array 50, in the vicinity of the upper surfaces (the polarized second-side end surfaces) of the permanent bar magnets 80, magnetic fields are generated from N-poles toward S-poles located adjacent and closest to the respective N-poles.

In other words, when the magnet array 50 is viewed in plane as shown in FIG. 21, a rightward magnetic field is generated from a certain N-pole toward an S-pole located on the right side of the N-pole; an upward magnetic field is generated from the N-pole toward an S-pole located on the upper side of the N-pole; a leftward magnetic field is generated from the N-pole toward an S-pole located on the left side of the N-pole; and a downward magnetic field is generated from the N-pole toward an S-pole located on the lower side of the N-pole. Similarly, a leftward magnetic field is generated toward a certain S-pole from an N-pole located on the right side of the S-pole; a downward magnetic field is generated toward the S-pole from an N-pole located on the upper side of the S-pole; a rightward magnetic field is generated toward the S-pole from an N-pole located on the left side of the S-pole; and an upward magnetic field is generated toward the S-pole from an N-pole located on the lower side of the S-pole. Lines of magnetic force associated with the magnetic fields pass along the yoke 60, through the rectangular portions 61b of the yoke 60, and immediately above the rectangular portions 61b. Accordingly, when a certain square portion 61a is noted, mutually orthogonal, very strong magnetic fields are locally generated at portions immediately above the adjacent rectangular portions 61b associated with the square portion 61a (i.e., at portions immediately above the rectangular portions 61b formed along the sides of the square portion 61a, that are adjacent each other in the square portion 61a).

Furthermore, the magnet array 50 has the openings 62. As has been described with reference to FIG. 10, the openings 62 are formed at positions where the centroids CP of squares formed by connecting lattice points SP of the tetragonal lattice; i.e., by connecting the centroids of the through holes 61 (square portions 61a) of the yoke 60, are located. That is, each of openings 62 is formed so as to surround a centroid CP of square formed by connecting adjacent lattice points SP of the tetragonal lattice. The positions where the openings 62 are formed are where lines of magnetic force extending (generating) from magnetic poles of the permanent bar magnets 80 intersect, with resultant instability in magnetic fields. Forming the openings 62 at the positions prevents intersection of lines of magnetic force, thereby eliminating instability in magnetic fields. Thus, stable, strong, uniform magnetic fields can be locally generated in the rectangular portions 61b and at portions immediately above the rectangular portions 61b.

Next, a method for manufacturing the magnetic sensor 10 (30) will be described.

Figure 22:
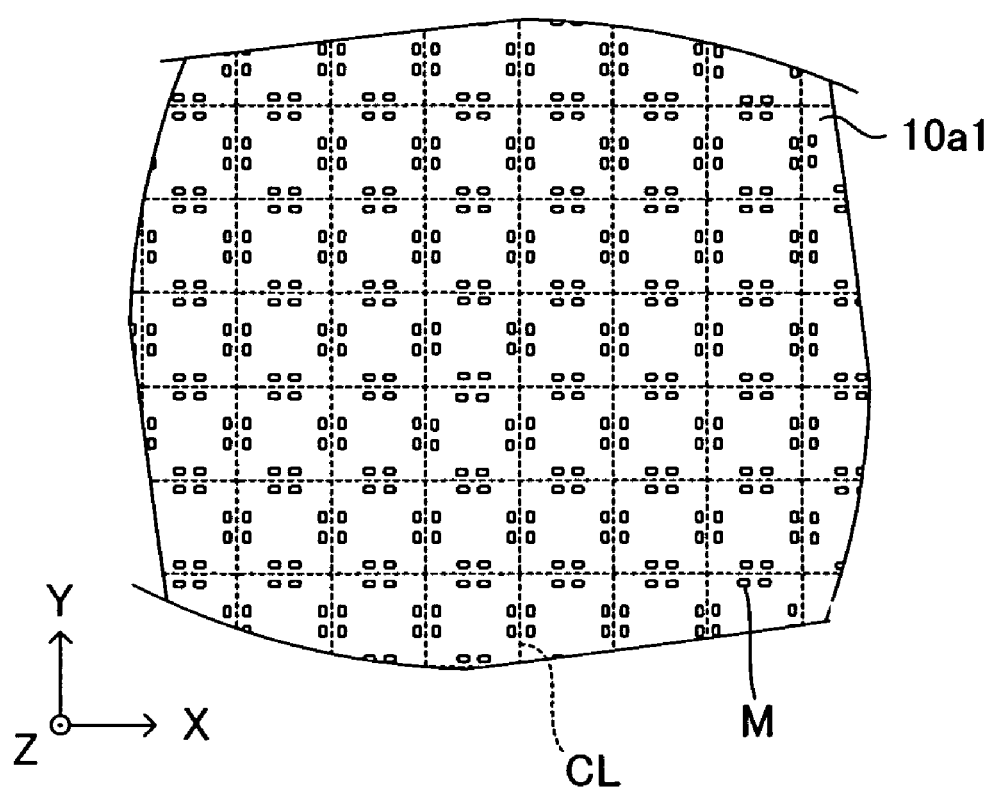
FIG. 22 is a partial plan view showing a wafer from which the magnetic sensors of FIGS. 1 and 2 are manufactured.

First, the dielectric layer 10b shown in FIGS. 3(B) and 4 is formed on a wafer (quartz glass or Si substrate) 10a1 shown in FIG. 22. At this time, predetermined wirings, LSIs, and unillustrated coils for initializing the free layers F are formed. The wafer 10a1 is cut at a later step along cutting lines CL represented by the broken line of FIG. 22, thereby yielding the substrates 10a and 30a.

Next, a plurality of films (element films) M to become the GMR elements 11 to 14, 21 to 24, 31 to 34, and 41 to 44 are formed. Specifically, films to become the bias magnet films 11b are formed. Then, films to become the synthetic spin valve films SAF, each film including a film to become the fixed layer, a film to become the spacer layer, and a film to become the free layer are formed on the films 11b. This film deposition process is performed by use of an ultra-high vacuum apparatus in such a manner that component films are continuously laminated with accurately controlled respective thicknesses.

The films are patterned to form a plurality of island-like films M, each of which has the same shape as the narrow strip portions 11a. The films M are to become island-like GMR elements. The films M are formed on the quartz glass 10a1 in such a manner that, when the quartz glass 10a1 is cut at a later step along the cutting lines CL represented by the broken line of FIG. 22 to thereby form the magnetic sensors 10 and 30 shown in FIGS. 1 and 2, the films M are arranged at the positions of the GMR elements 11 to 14, 21 to 24, 31 to 34, and 41 to 44.

In other words, according to the above-described process, at least two (a plurality of) island-like element films M, each element film M including a film to become the synthetic spin valve film SAF, are disposed on the substrate (wafer 10a1). As viewed in plane, the at least two element films M are formed such that, while one element film M is disposed at a position corresponding to (i.e., disposed inside of) a certain rectangular portion 61*b* formed along a certain side of a certain square portion 61*a* of the magnet array 50, the other element film M is disposed at a position corresponding to (i.e., disposed inside of) another rectangular portion 61*b* formed along a side of the square portion 61*a* adjacent to the former side of the square portion 61*a*.

Figure 23:
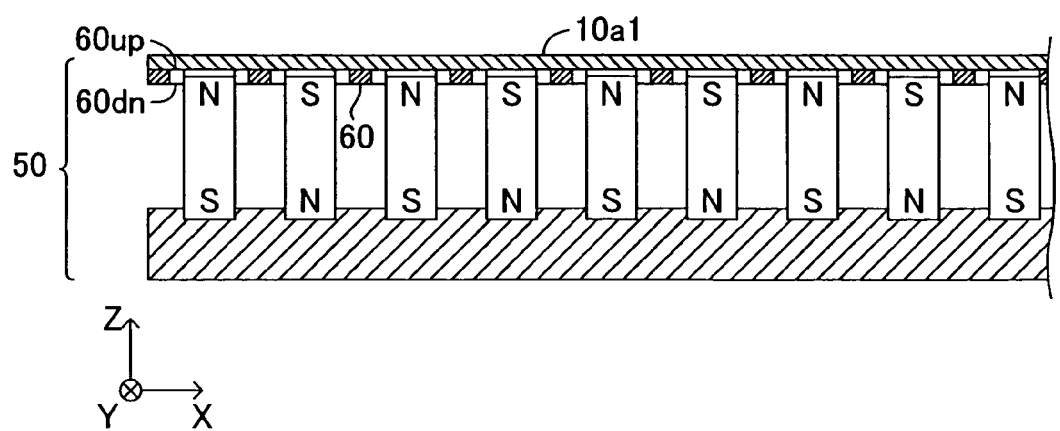
FIG. 23 is a partial, sectional view showing the magnet array and the wafer, representing a method for pinning magnetizations of pinned layers of GMR elements of the magnetic sensors of FIGS. 1 and 2 in respectively fixed directions.
Figure 24:
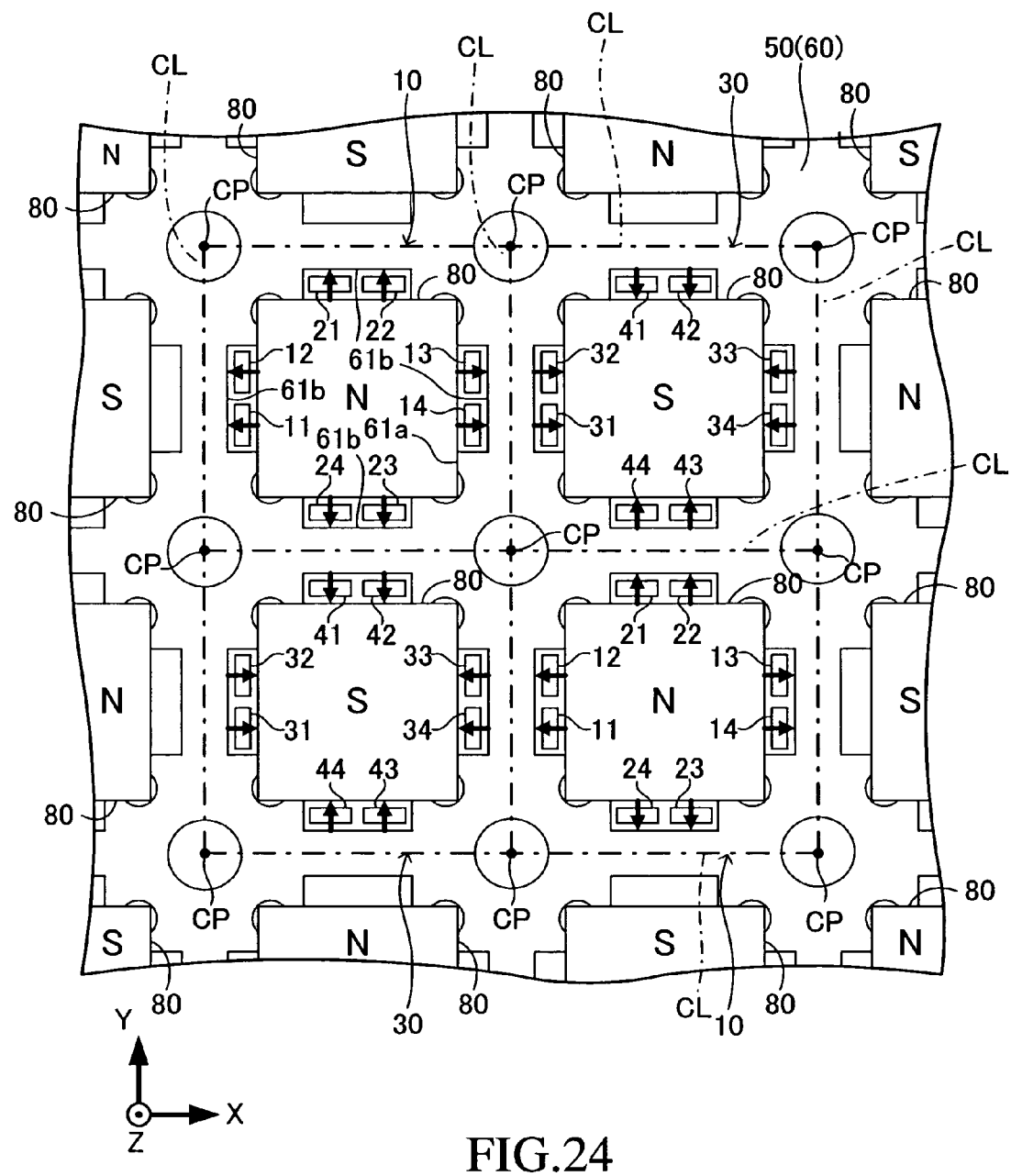
FIG. 24 is a conceptual view showing the method for pinning magnetizations of pinned layers of GMR elements of the magnetic sensors of FIGS. 1 and 2 in respectively fixed directions.

Next, the wafer 10*a*1 on which the films M are formed, and the magnet array 50 are arranged as shown in FIG. 23. In this arrangement, the side of the wafer 10*a*1 on which the films M are formed is brought into contact with the upper surface 60*up* of the yoke 60. Furthermore, as shown in FIG. 24, the wafer 10*a*1 and the magnet array 50 are arranged in such a relation that each of the intersection points CP of the cutting lines CL corresponding to sides of the magnetic sensors 10 and 30, coincides with the centroid of a group of four adjacent permanent bar magnets 80. As a result, while the wafer 10*a*1 is placed on the upper surface of the magnet array 50, as represented by the arrows of FIG. 24, magnetic fields are applied to the films M perpendicularly to the longitudinal direction of the narrow strip portions 11*a* of the films M.

Next, the wafer 10*a*1 and the magnet array 50, which are arranged in the above-mentioned relation, are heated to a temperature of 250° C. to 280° C. (preferably 270° C.) in a vacuum and are held at the temperature for about three hours.

In other words, the wafer 10*a*1 is disposed in the proximity of the magnet array 50 such that, as viewed in plane, while one element film M is disposed at a position corresponding to (i.e., disposed inside of) a certain rectangular portion 61*b* formed along a certain side of a certain square portion 61*a* of the magnet array 50, another element film M is disposed at a position corresponding to (i.e., disposed inside of) another rectangular portion 61*b* formed along a side of the square portion 61*a* adjacent to the former side of the square portion 61*a*, magnetic fields generated in the vicinity of (at portions immediately above) the rectangular portions 61*b* of the magnet array 50 are applied to the element films M, and the wafer 10*a*1 having the element films M are held at high temperature, whereby the magnetizations of films (pinned layers) to become the fixed layers of the plurality of element films M are simultaneously pinned in respectively fixed directions.

Subsequently, the wafer 10*a*1 is allowed to stand without application of heat until the wafer 10*a*1 cools to the room temperature. Then, the wafer 10*a*1 is unloaded from the vacuum apparatus. Wirings for connecting the films M, and the like are formed. Finally, the wafer 10*a*1 is cut along the cutting lines CL shown in FIGS. 22 and 24. Thus, a large number of monolithic (single-chip) magnetic sensors 10 and 30 shown in FIGS. 1 and 2 are manufactured at a time.

As described above, the present embodiment performs the heat treatment process in which strong magnetic fields are locally generated by use of the magnet array 50 and are used for pinning the magnetization directions of pinned layers of the synthetic spin valve films SAF. The magnet array 50 includes the yoke 60 in which the rectangular portions 61*b* are formed and function as air gaps. Accordingly, by use of the magnet array 50, strong, uniform magnetic fields can be generated in spaces in the vicinity of the rectangular portions 61*b*, so that magnetizations of pinned layers of the synthetic spin valve films SAF can be reliably pinned in respectively fixed directions.

Furthermore, in the yoke 60 of the magnet array 50, the openings 62 are formed at portions where lines of magnetic force extending from magnetic poles would otherwise intersect with resultant instability in magnetic fields. As a result, directional properties of lines of magnetic force become stable, and thus magnetic fields in the vicinity of the openings 62 can be stabilized to a greater extent. Also, the openings 62 are utilized in adjusting the distance between the yoke 60 and the array substrate 70 of the magnetic array 50 (height of the yoke 60). As a result, since the position of the yoke 60 in the height direction can be adjusted readily and ideally, optimal magnetic fields can be applied to portions at which films which are to become the pinned layers and whose magnetizations are to be pinned in respectively fixed directions are located.

As described above, the magnet array 60 can generate mutually intersecting (orthogonal), strong uniform magnetic fields in adjacent regions (at portions immediately above the adjacent rectangular portions 61*b*). Accordingly, there can be readily manufactured a biaxial magnetic sensor that employs the synthetic spin valve films SAF having excellent heat resistance, excellent resistance to strong magnetic fields, and good temperature characteristics.

Additionally, the square portion 61*a* of each of the through holes 61 has marginal portions 61*c* which are formed at corresponding corners of the square portion 61*a* in such a manner as to expand diagonally outward. Accordingly, even when, in the process of etching the through holes 61, corner portions of the square portions 61*a* are insufficiently etched, the permanent bar magnets 80 can be reliably inserted through the corresponding through holes 61.

Figure 25:
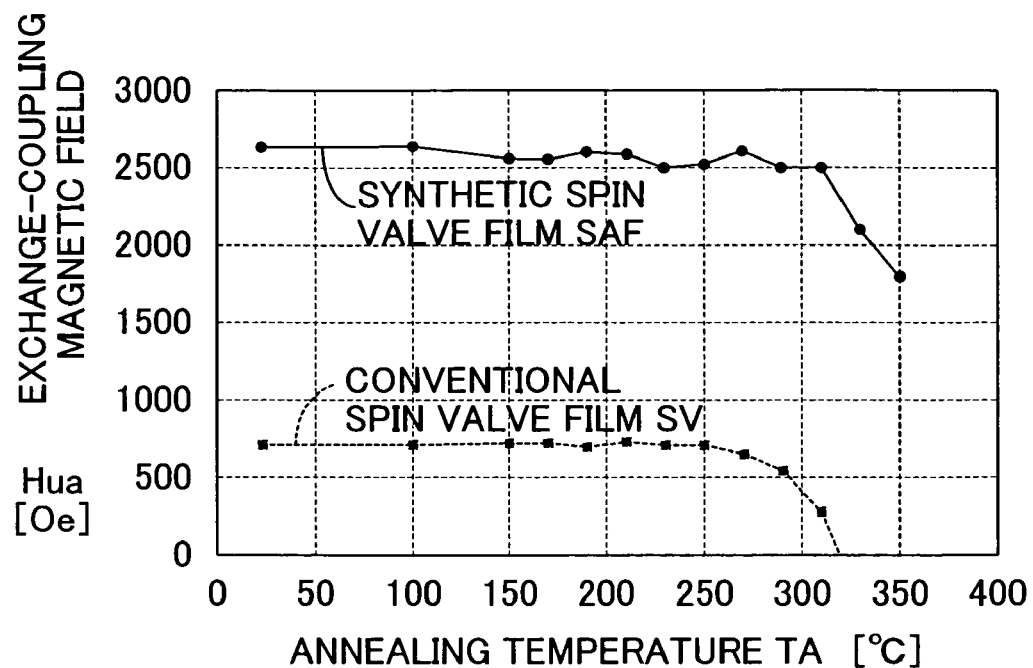
FIG. 25 is a graph showing the results of study on the relation between an annealing temperature and an exchange-coupling magnetic field with respect to a conventional spin valve film, and a synthetic spin valve film manufactured by the method of the present invention.

The graph of FIG. 25 shows the results of study on the relation between an annealing temperature TA and an exchange-coupling magnetic field Hua with respect to the conventional spin valve film SV and the above-manufactured synthetic spin valve film SAF. The annealing temperature TA is a predetermined temperature at which the GMR element is held for annealing. More specifically, the GMR element is annealed as follows: while a magnetic field of a predetermined intensity (1000*e* in the example of FIG. 25) is applied to the GMR element in a direction opposite the pinned magnetization direction of the pinned layer of the GMR element, the GMR element is held at the annealing temperature TA through application of heat; subsequently, the GMR element is allowed to cool to the room temperature. The exchange-coupling magnetic field Hua is a magnetic field H that causes the following: when the magnetic field H is applied to the annealed GMR element at the room temperature in a direction opposite the pinned magnetization direction of the pinned layer of the annealed GMR element, the magnetization direction of the pinned layer changes from the initially fixed magnetization direction.

As is apparent from FIG. 25, the synthetic spin valve film SAF manufactured by the method of the present embodiment exhibits a value of the exchange-coupling magnetic field Hua higher than that of the conventional spin valve film SV and maintains the exchange-coupling magnetic field Hua at high level until a higher annealing temperature is reached as compared with the conventional spin valve film SV.

Figure 26:
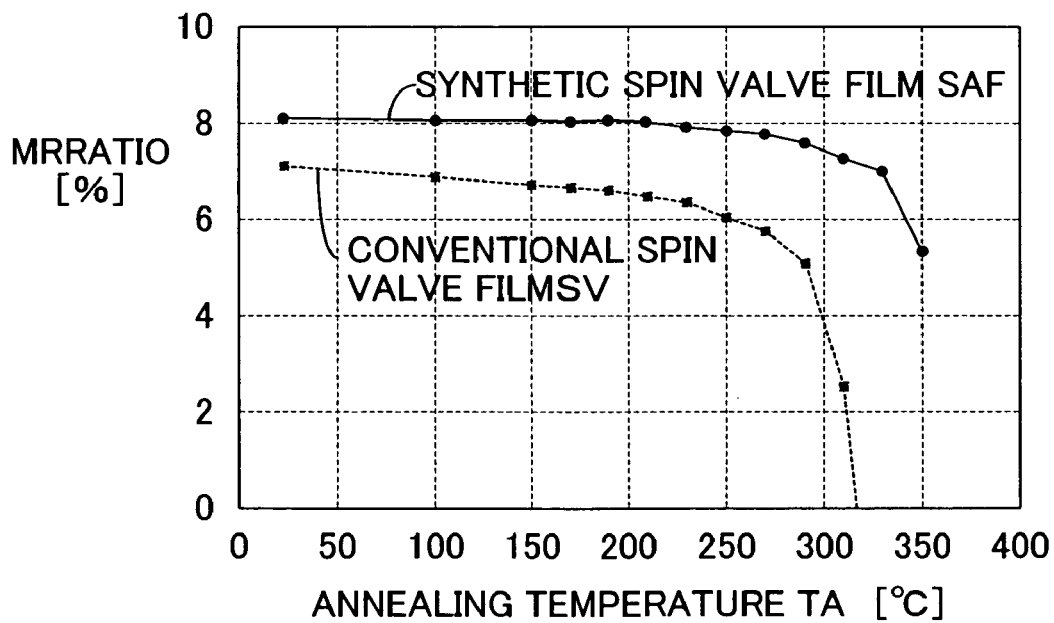
FIG. 26 is a graph showing the results of study on the relation between an annealing temperature and MR ratio with respect to the conventional spin valve film, and the synthetic spin valve film manufactured by the method of the present invention.

The graph of FIG. 26 shows the results of study on the relation between the annealing temperature TA and an MR ratio with respect to the conventional spin valve film SV and the above-manufactured synthetic spin valve film SAF. As is apparent from FIG. 26, the synthetic spin valve film SAF manufactured by the method of the present embodiment exhibits a value of the MR ratio higher than that of the conventional spin valve film SV and maintains the MR ratio at high level until a higher annealing temperature is reached as compared with the conventional spin valve film SV. That is, the synthetic spin valve film SAF manufactured by the method of the present embodiment exhibits higher heat resistance as compared with the conventional spin valve film SV. Therefore, even when the manufacture of the magnetic sensors 10 and 30 involves a high-temperature process, such as a process of forming a protective film (passivation treatment) or a soldering process after magnetizations of the fixed layers of the synthetic valve films SAF are pinned in respectively fixed directions, the magnetic sensors 10 and 30 having consistent characteristics can be obtained.

Next, performance was compared between a magnetic sensor having the synthetic spin valve film SAF (whose pinned layer is such that magnetization is pinned in a fixed direction) manufactured by use of the magnet array 50, which includes the yoke 60, and a magnetic sensor having the synthetic spin valve film SAF manufactured by use of a magnet array prepared by removing the yoke 60 from the magnet array 50.

Figure 27:
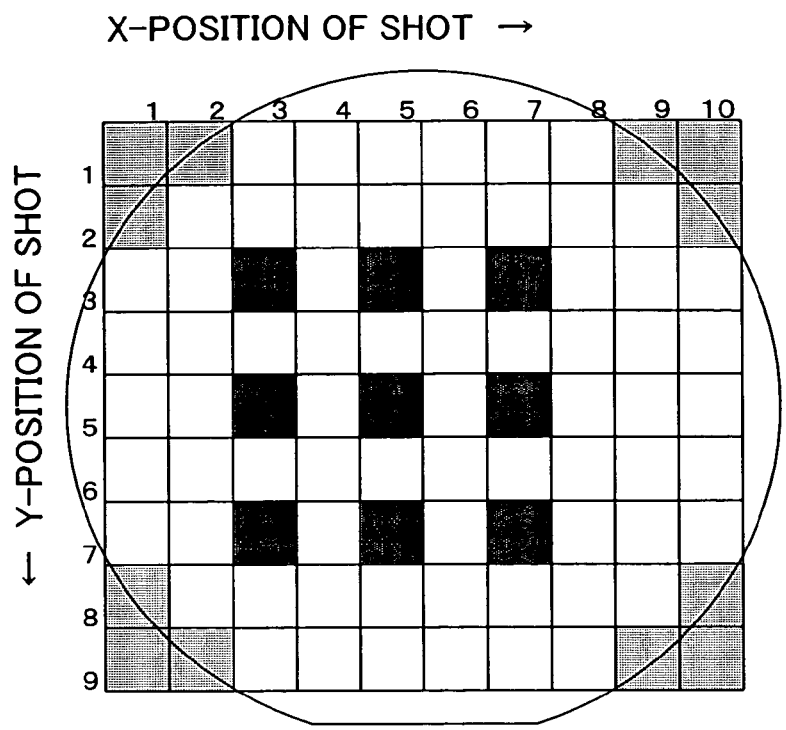
FIG. 27 is a conceptual view showing a positioning grid for magnetic sensors on a wafer.
Figure 28:
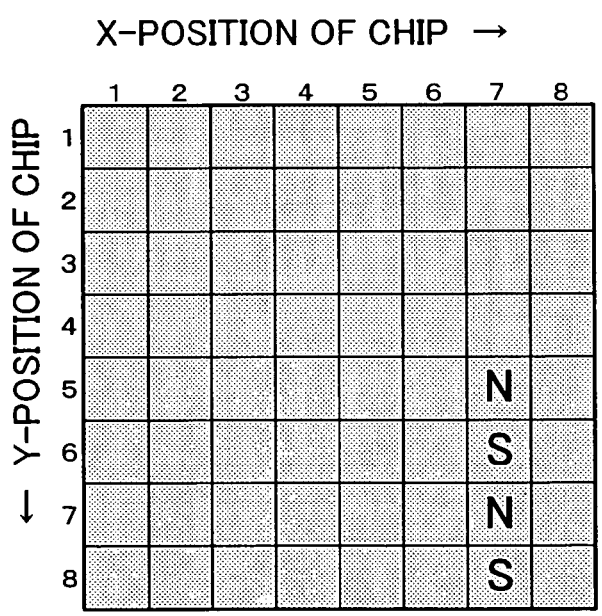
FIG. 28 is a conceptual view showing a positioning grid for magnetic sensors on a wafer.

FIGS. 27 and 28 are schematic views showing the locations on a wafer of the magnetic sensors used for experiments. FIG. 27 shows a wafer on which a large number of the films M are formed. FIG. 28 is an enlarged view of one of square portions shown in FIG. 27.

Figure 29:
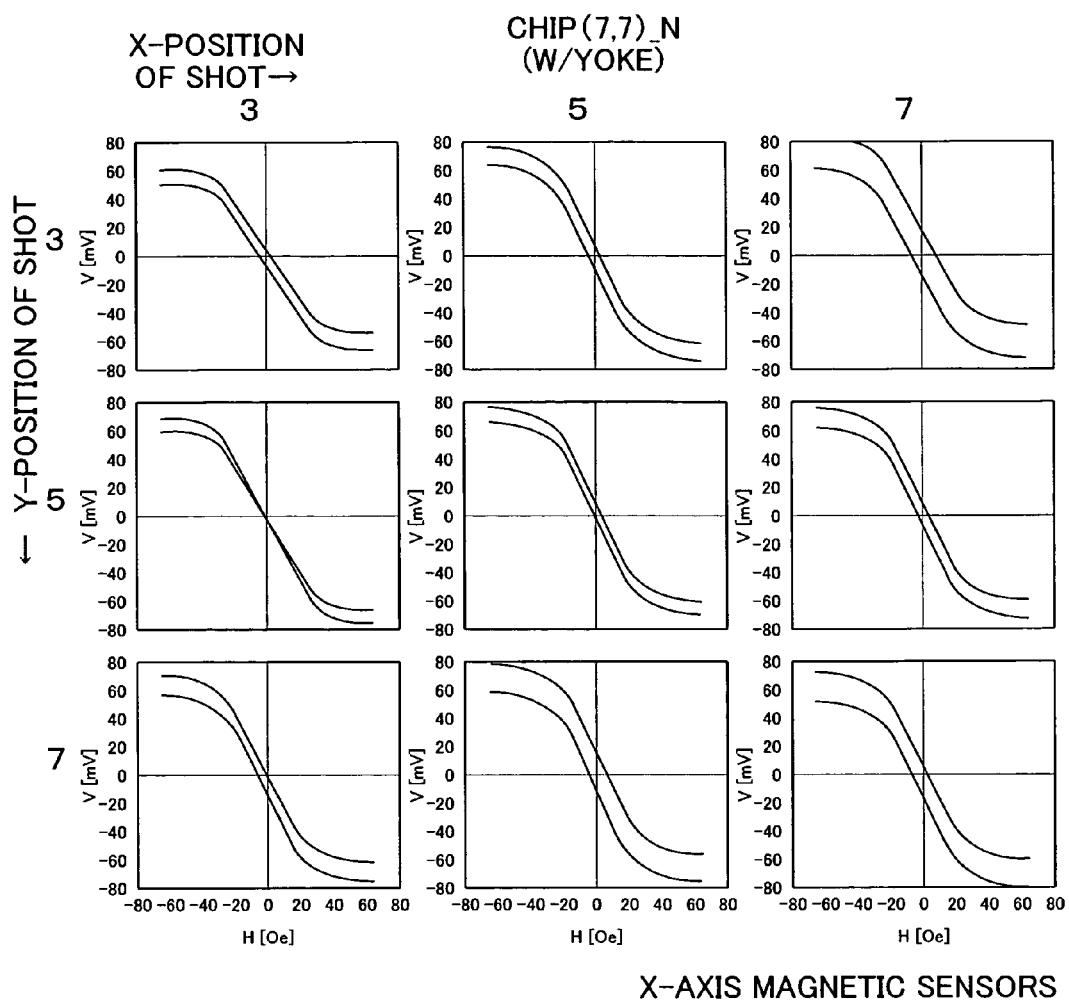
FIG. 29 is a graph showing output voltage characteristics of X-axis magnetic sensors located at various positions on the wafer of FIGS. 27 and 28 and manufactured by use of the magnet array of FIG. 7.
Figure 30:
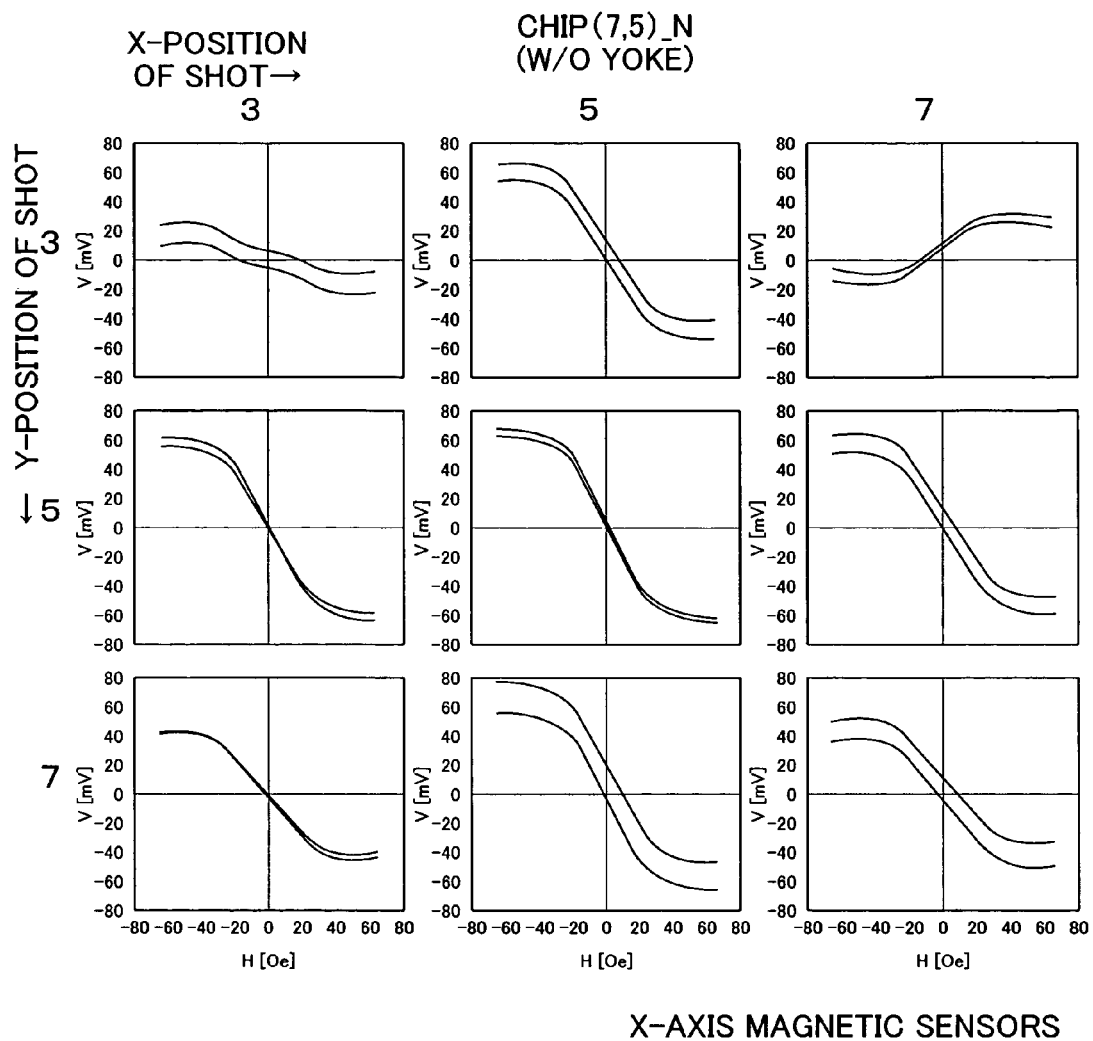
FIG. 30 is a graph showing output voltage characteristics of X-axis magnetic sensors located at various positions on the wafer of FIGS. 27 and 28 and manufactured by use of a magnet array prepared by removing the yoke from the magnet array of FIG. 7.

FIG. 29 shows characteristics (variation of output voltage with external magnetic field) of X-axis magnetic sensors located at a chip position (X-position, Y-position) of (7, 7) shown in FIG. 28 in a shot position (X-position, Y-position) of (3, 3), (3, 5), . . . , (7, 5), and (7, 7) shown in FIG. 27. The X-axis magnetic sensors are manufactured by use of the magnet array 50, which includes the yoke 60. FIG. 30 shows characteristics of X-axis magnetic sensors located at a chip position (X-position, Y-position) of (7, 5) shown in FIG. 28 in a shot position (X-position, Y-position) of (3, 3), (3, 5), . . . , (7, 5), and (7, 7) shown in FIG. 27. The X-axis magnetic sensors are manufactured by use of a magnet array prepared by removing the yoke 60 from the magnet array 50.

As is apparent from comparison between FIGS. 29 and 30, among the X-axis magnetic sensors manufactured by use of the magnet array prepared by removing the yoke 60 from the magnet array 50, the X-axis magnetic sensor formed in the shot position of (7, 3) exhibits an inverted characteristic curve as compared with normal X-axis magnetic sensors; and the X-axis magnetic sensor formed in the shot position of (3, 3) exhibits a poor output characteristic. By contrast, the X-axis magnetic sensors manufactured by use of the magnet array 50, which includes the yoke 60, exhibit a consistent output characteristic, irrespective of the shot position.

Figure 31:
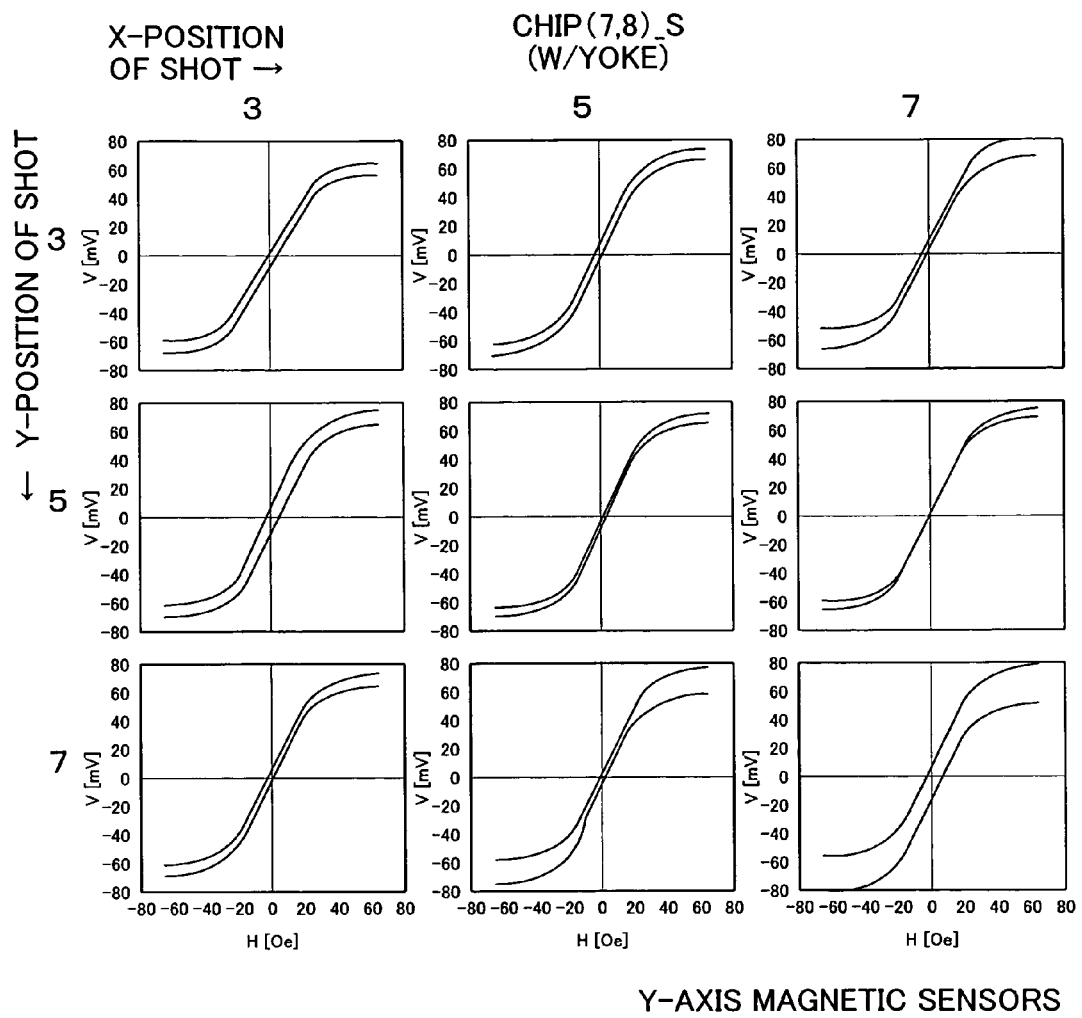
FIG. 31 is a graph showing output voltage characteristics of Y-axis magnetic sensors located at various positions on the wafer of FIGS. 27 and 28 and manufactured by use of the magnet array of FIG. 7.
Figure 32:
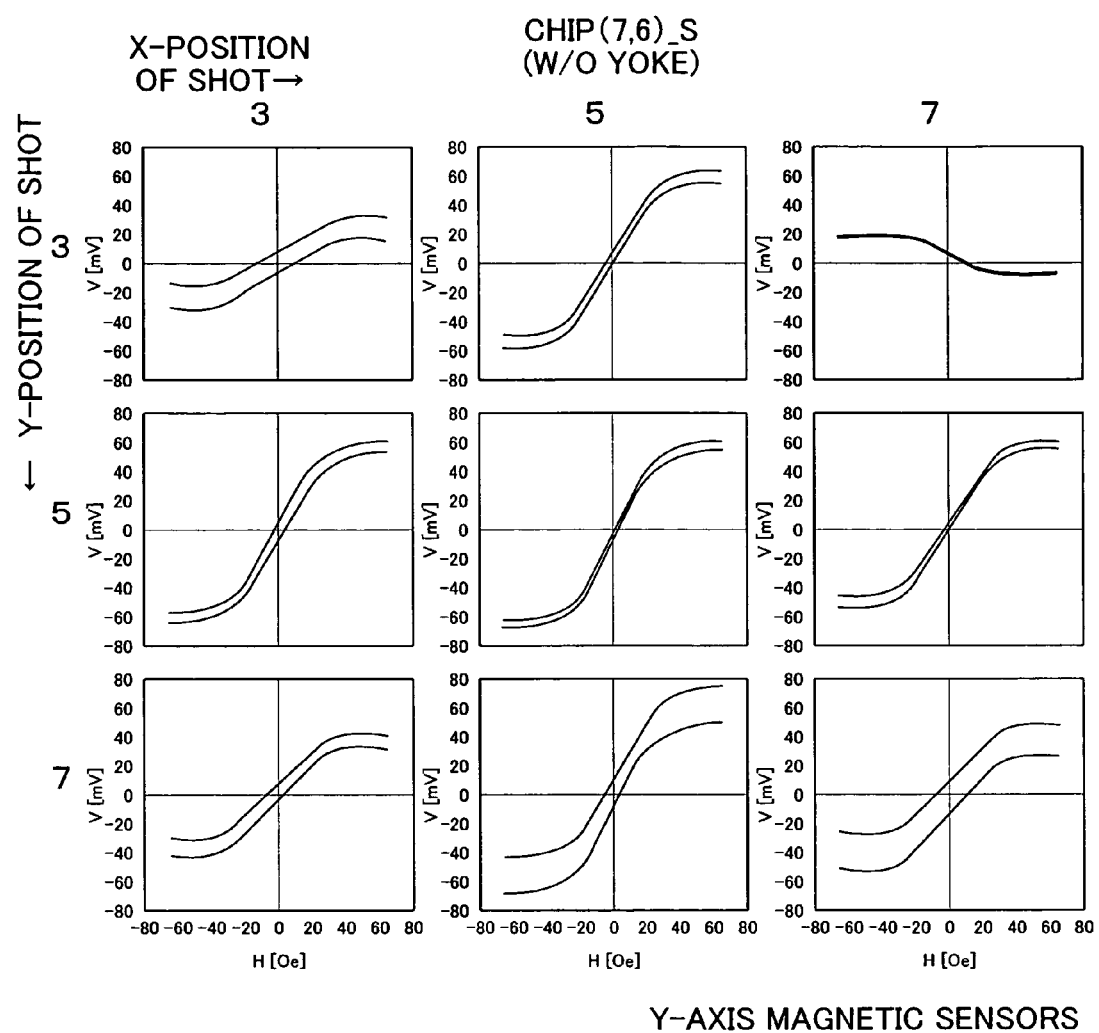
FIG. 32 is a graph showing output voltage characteristics of Y-axis magnetic sensors located at various positions on the wafer of FIGS. 27 and 28 and manufactured by use of the magnet array prepared by removing the yoke from the magnet array of FIG. 7.

FIG. 31 shows characteristics of Y-axis magnetic sensors located at a chip position (X-position, Y-position) of (7, 8) shown in FIG. 28 in a shot position (X-position, Y-position) of (3, 3), (3, 5), . . . , (7, 5), and (7, 7) shown in FIG. 27. The Y-axis magnetic sensors are manufactured by use of the magnet array 50, which includes the yoke 60. FIG. 32 shows characteristics of Y-axis magnetic sensors located at a chip position (X-position, Y-position) of (7, 6) shown in FIG. 28 in a shot position (X-position, Y-position) of (3, 3), (3, 5), . . . , (7, 5), and (7, 7) shown in FIG. 27. The Y-axis magnetic sensors are manufactured by use of a magnet array prepared by removing the yoke 60 from the magnet array 50.

As is apparent from comparison between FIGS. 30 and 31, among the Y-axis magnetic sensors manufactured by use of the magnet array prepared by removing the yoke 60 from the magnet array 50, the Y-axis magnetic sensor formed in the shot position of (7, 3) exhibits an inverted characteristic curve as compared with normal Y-axis magnetic sensors; and the Y-axis magnetic sensor formed in the shot position of (3, 3) exhibits a poor output characteristic. By contrast, the Y-axis magnetic sensors manufactured by use of the magnet array 50, which includes the yoke 60, exhibit a consistent output characteristic, irrespective of the shot position.

Figure 33:
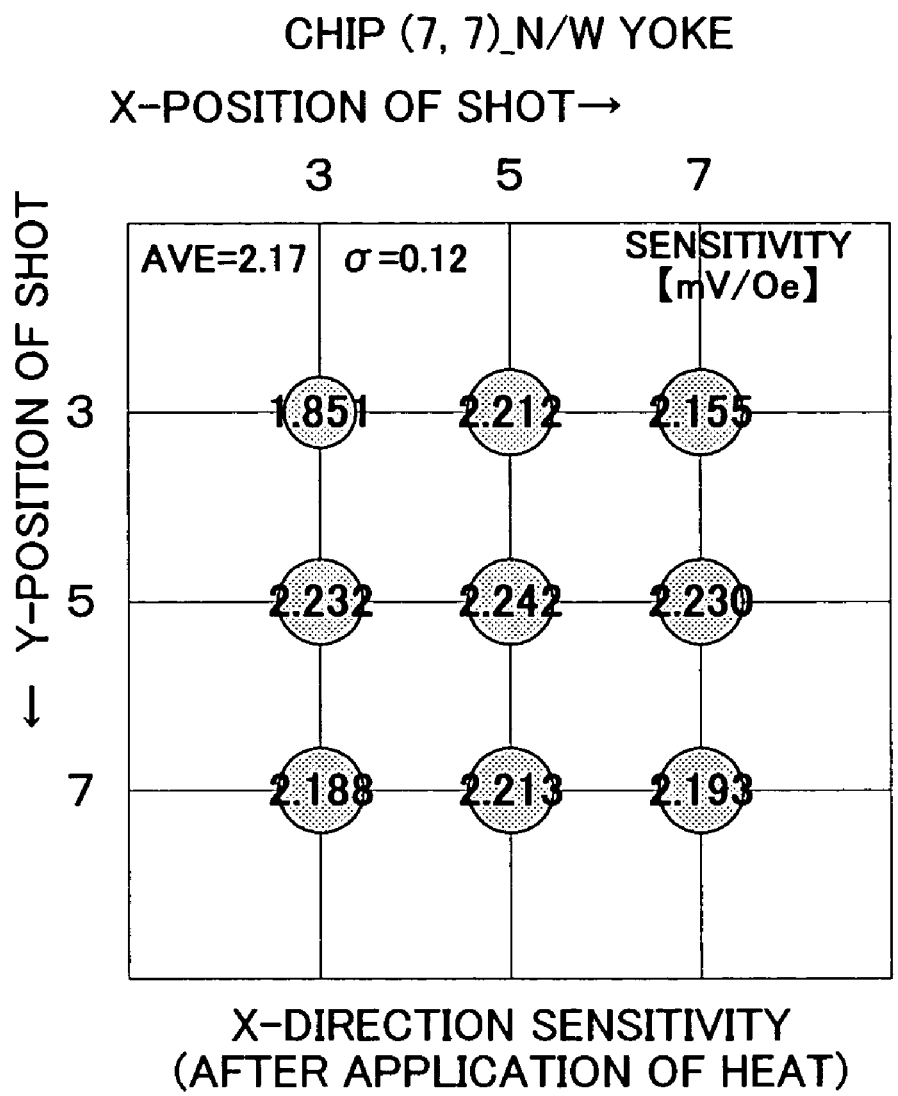
FIG. 33 is a diagram showing sensitivities of X-axis magnetic sensors located at various positions on the wafer of FIGS. 27 and 28 and manufactured by use of the magnet array of FIG. 7.
Figure 34:
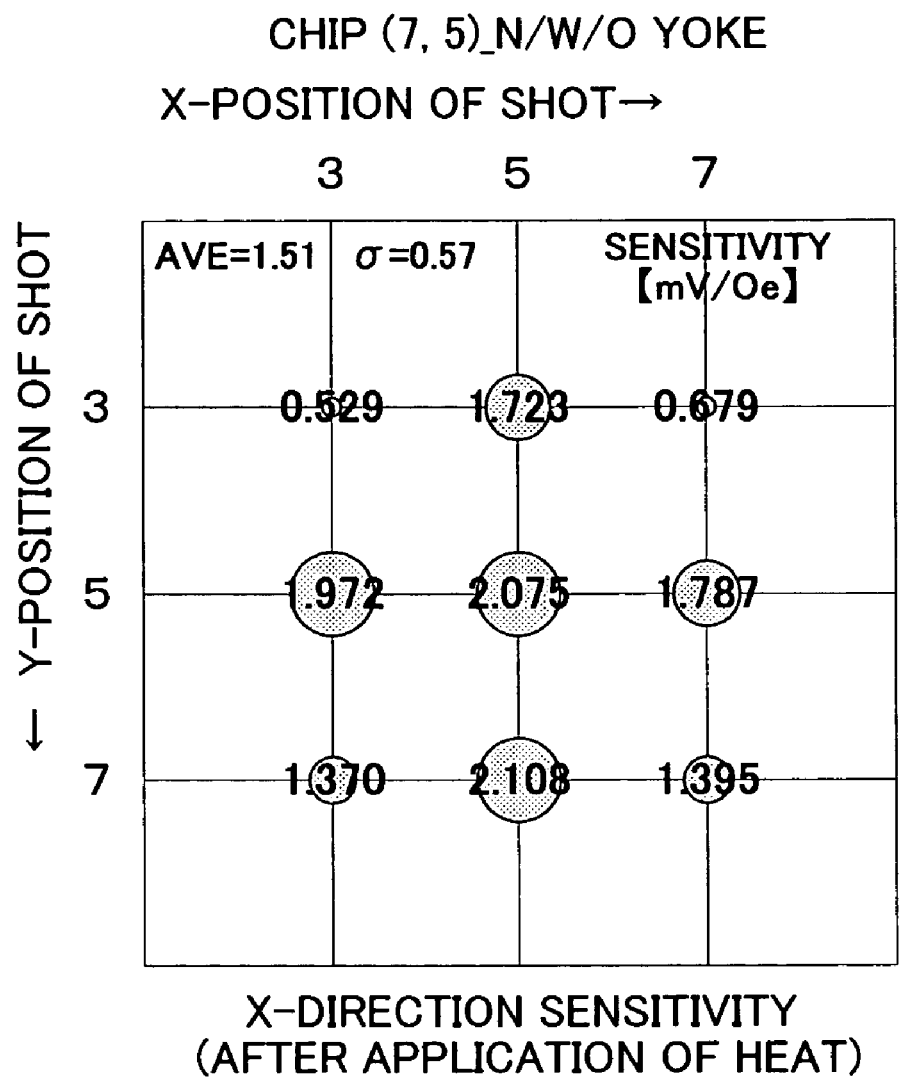
FIG. 34 is a diagram showing sensitivities of X-axis magnetic sensors located at various positions on the wafer of FIGS. 27 and 28 and manufactured by use of a magnet array prepared by removing the yoke from the magnet array of FIG. 7.

FIG. 33 shows the sensitivity (variation of output voltage per unit magnetic field strength) of X-axis magnetic sensors located at a chip position of (7, 7) in the above-mentioned shot positions and manufactured by use of the magnet array 50, which includes the yoke 60. FIG. 34 shows the sensitivity of X-axis magnetic sensors located at a chip position of (7, 5) in the above-mentioned shot positions and manufactured by use of the magnet array prepared by removing the yoke 60 from the magnet array 50.

Figure 35:
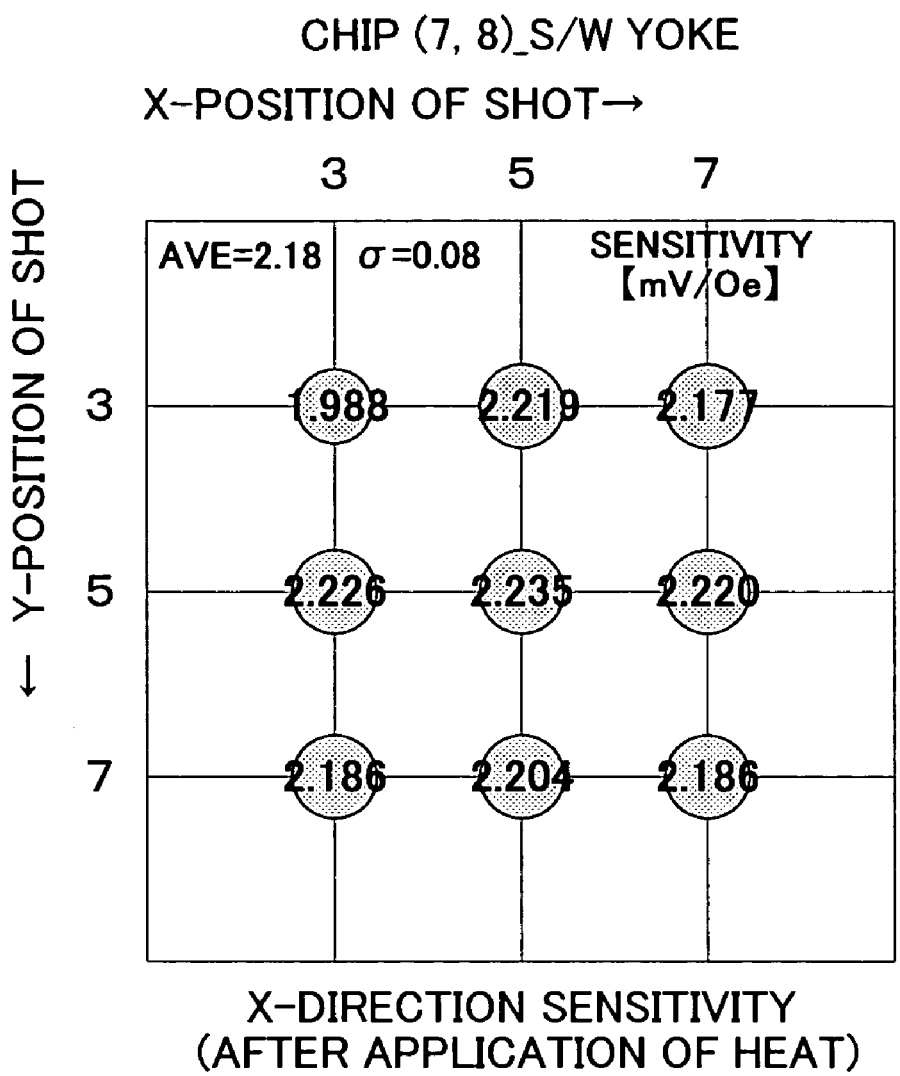
FIG. 35 is a diagram showing sensitivities of X-axis magnetic sensors located at various positions on the wafer of FIGS. 27 and 28 and manufactured by use of the magnet array of FIG. 7.
Figure 36:
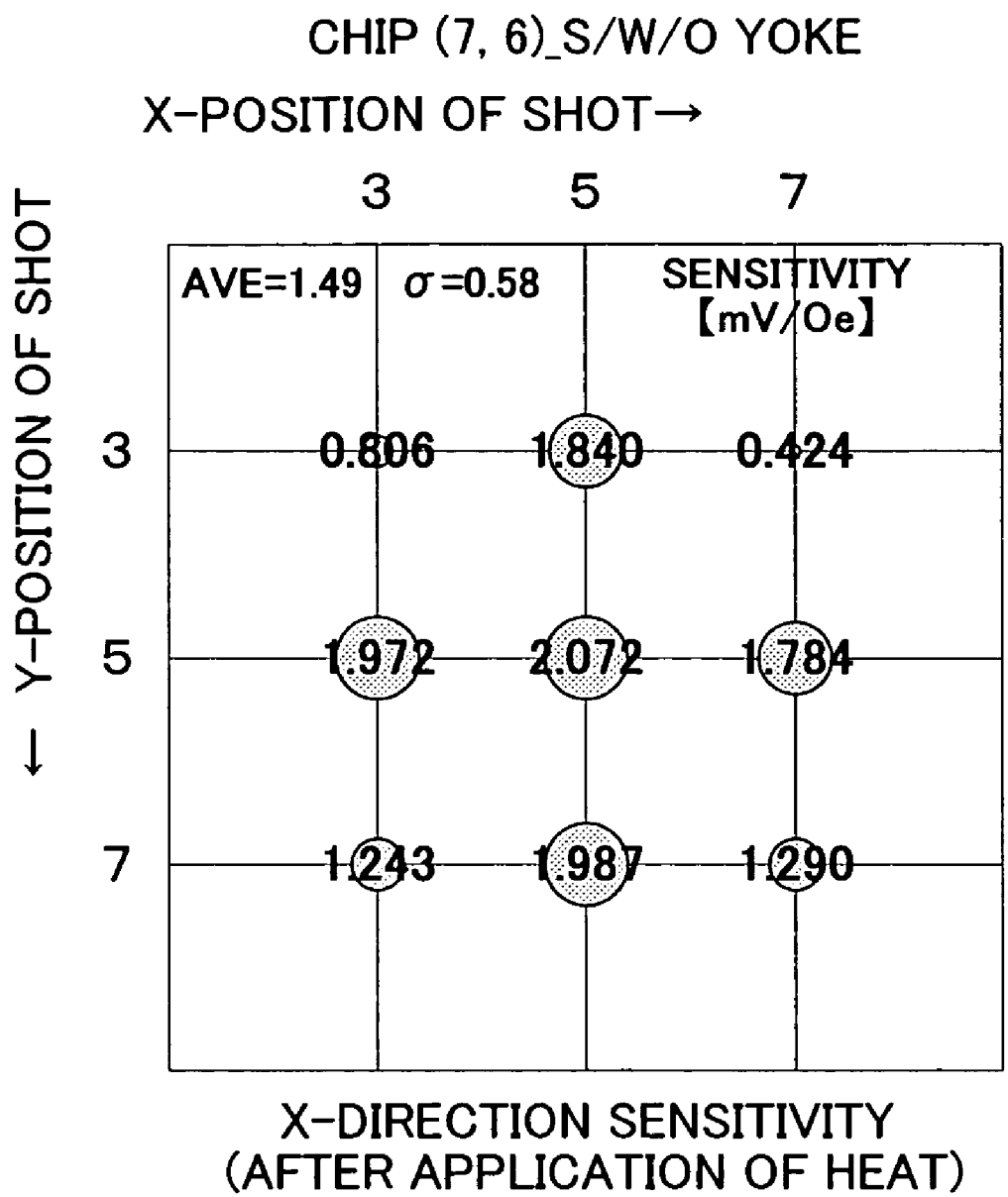
FIG. 36 is a diagram showing sensitivities of X-axis magnetic sensors located at various positions on the wafer of FIGS. 27 and 28 and manufactured by use of the magnet array prepared by removing the yoke from the magnet array of FIG. 7.

FIG. 35 shows the sensitivity of X-axis magnetic sensors located at a chip position of (7, 8) in the above-mentioned shot positions and manufactured by use of the magnet array 50, which includes the yoke 60. FIG. 36 shows the sensitivity of X-axis magnetic sensors located at a chip position of (7, 6) in the above-mentioned shot positions and manufactured by use of the magnet array prepared by removing the yoke 60 from the magnet array 50.

Figure 37:
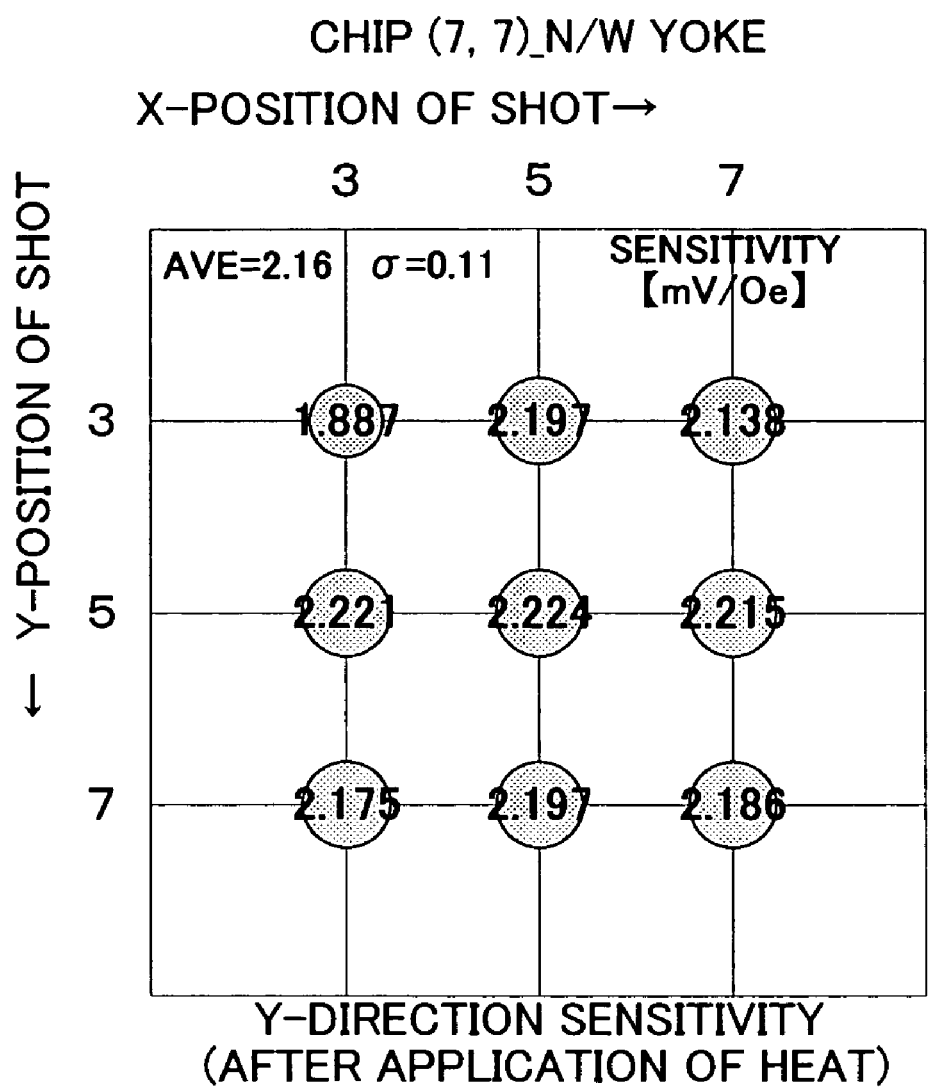
FIG. 37 is a diagram showing sensitivities of Y-axis magnetic sensors located at various positions on the wafer of FIGS. 27 and 28 and manufactured by use of the magnet array of FIG. 7.
Figure 38:
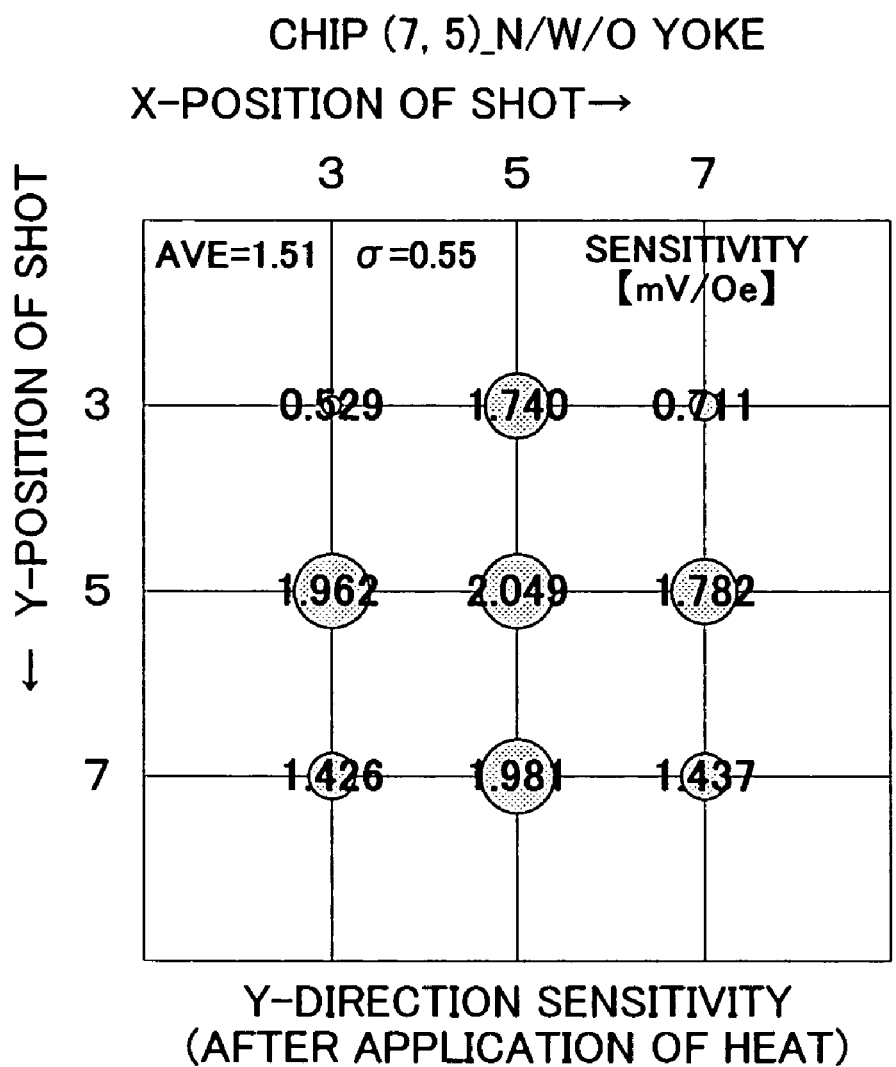
FIG. 38 is a diagram showing sensitivities of Y-axis magnetic sensors located at various positions on the wafer of FIGS. 27 and 28 and manufactured by use of the magnet array prepared by removing the yoke from the magnet array of FIG. 7.

FIG. 37 shows the sensitivity of Y-axis magnetic sensors located at a chip position of (7, 7) in the above-mentioned shot positions and manufactured by use of the magnet array 50, which includes the yoke 60. FIG. 38 shows the sensitivity of Y-axis magnetic sensors located at a chip position of (7, 5) in the above-mentioned shot positions and manufactured by use of the magnet array prepared by removing the yoke 60 from the magnet array 50.

Figure 39:
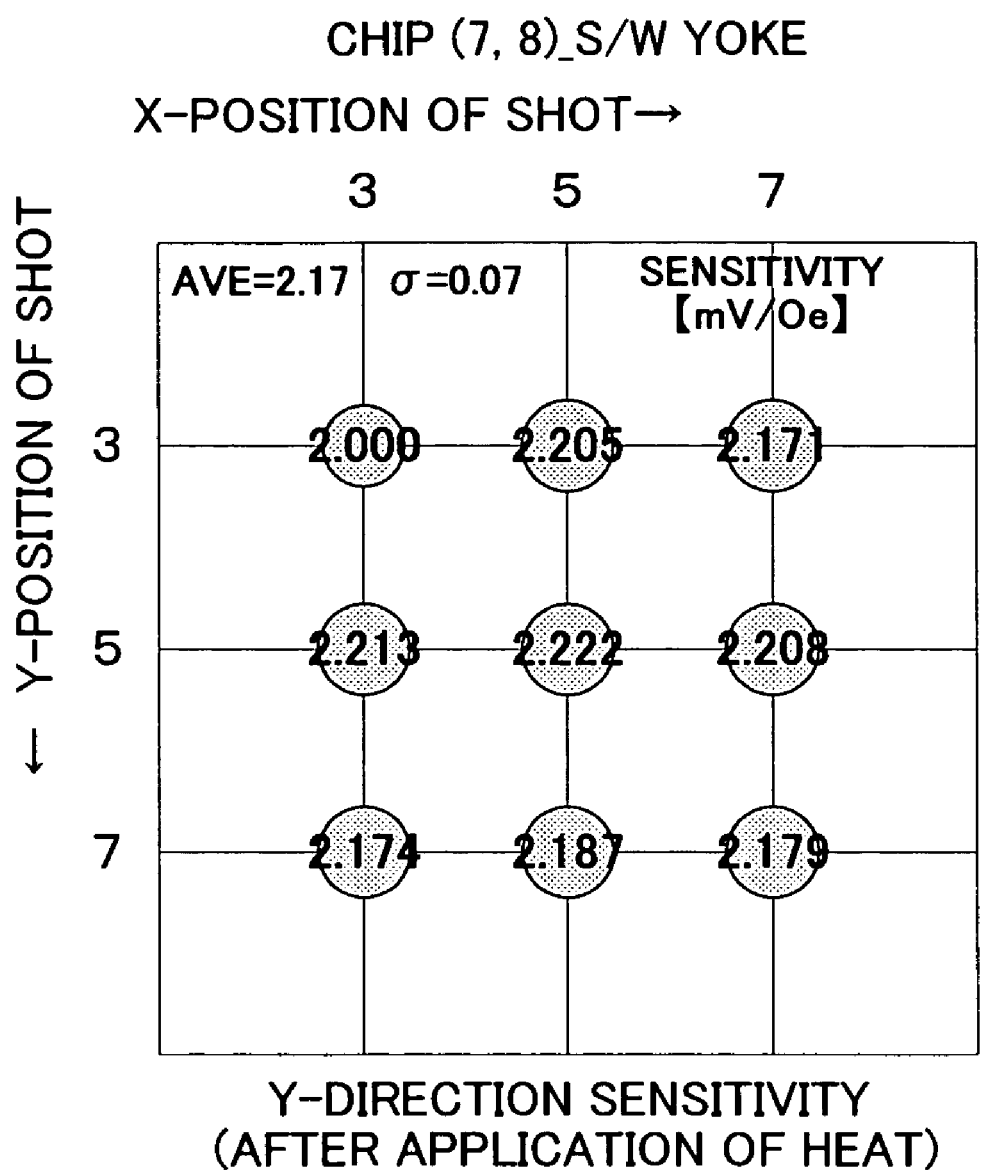
FIG. 39 is a diagram showing sensitivities of Y-axis magnetic sensors located at various positions on the wafer of FIGS. 27 and 28 and manufactured by use of the magnet array of FIG. 7.
Figure 40:
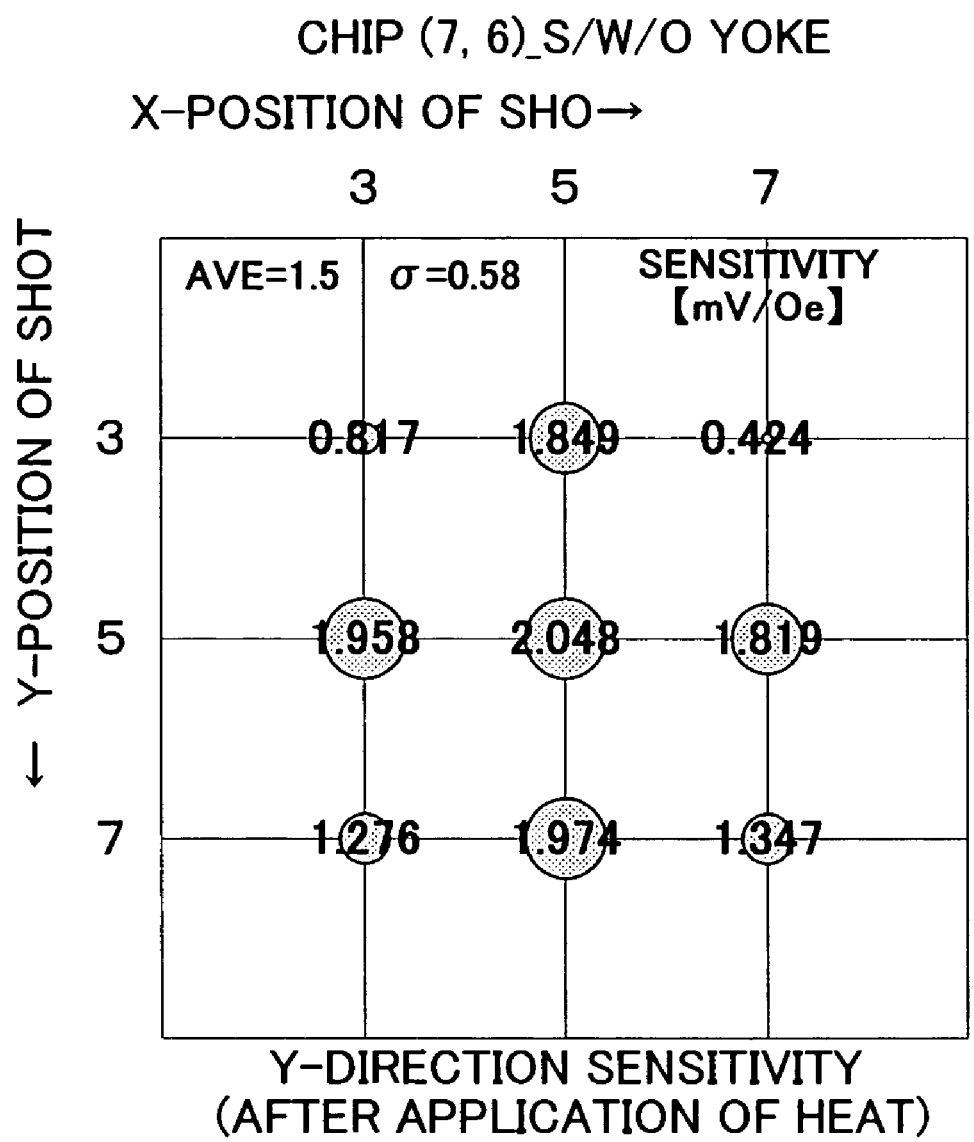
FIG. 40 is a diagram showing sensitivities of Y-axis magnetic sensors located at various positions on the wafer of FIGS. 27 and 28 and manufactured by use of the magnet array prepared by removing the yoke from the magnet array of FIG. 7.

FIG. 39 shows the sensitivity of Y-axis magnetic sensors located at a chip position of (7, 8) in the above-mentioned shot positions and manufactured by use of the magnet array 50, which includes the yoke 60. FIG. 40 shows the sensitivity of Y-axis magnetic sensors located at a chip position of (7, 6) in the above-mentioned shot positions and manufactured by use of the magnet array prepared by removing the yoke 60 from the magnet array 50.

As is apparent from FIGS. 33 to 40, the magnetic sensors that were manufactured by use of the magnet array 50, which includes the yoke 60, exhibit good sensitivity. By contrast, the magnetic sensors that were manufactured by use of the magnet array which does not have the yoke 60 include those whose sensitivity is poor. This indicates that a biaxial magnetic sensor manufactured by use of the magnet array 50 of the present invention exhibits excellent heat resistance and an excellent output characteristic.

Figure 41:
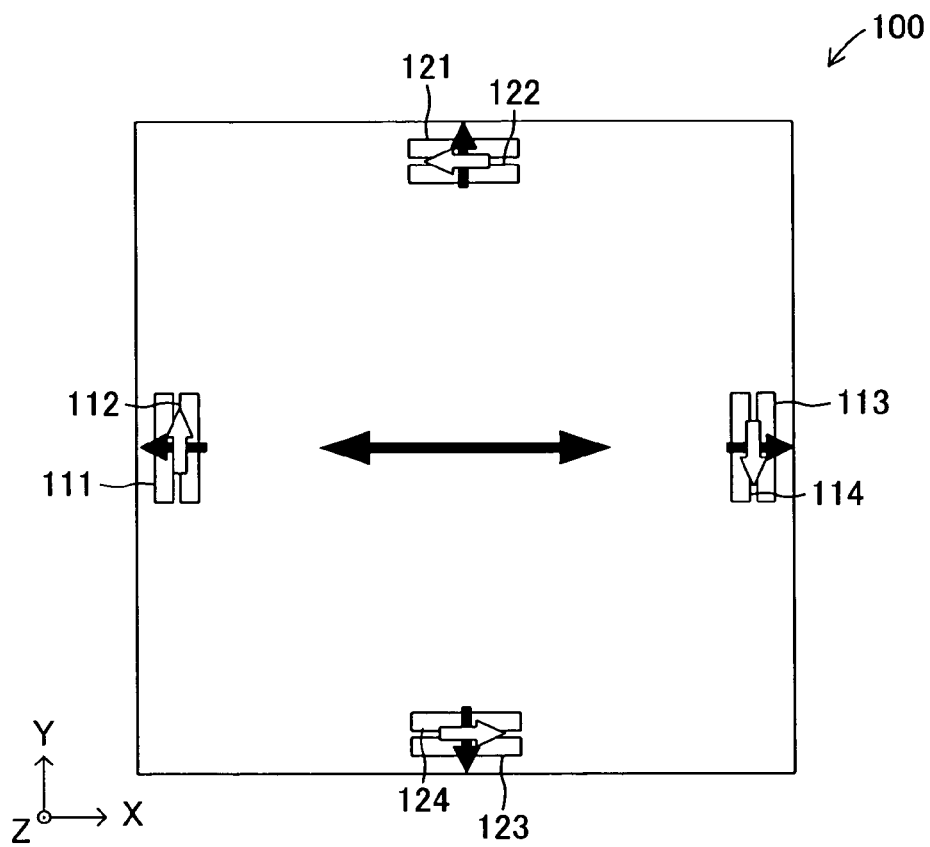
FIG. 41 is a plan view showing an embodiment of another magnetic sensor according to the present invention.
Figure 42:
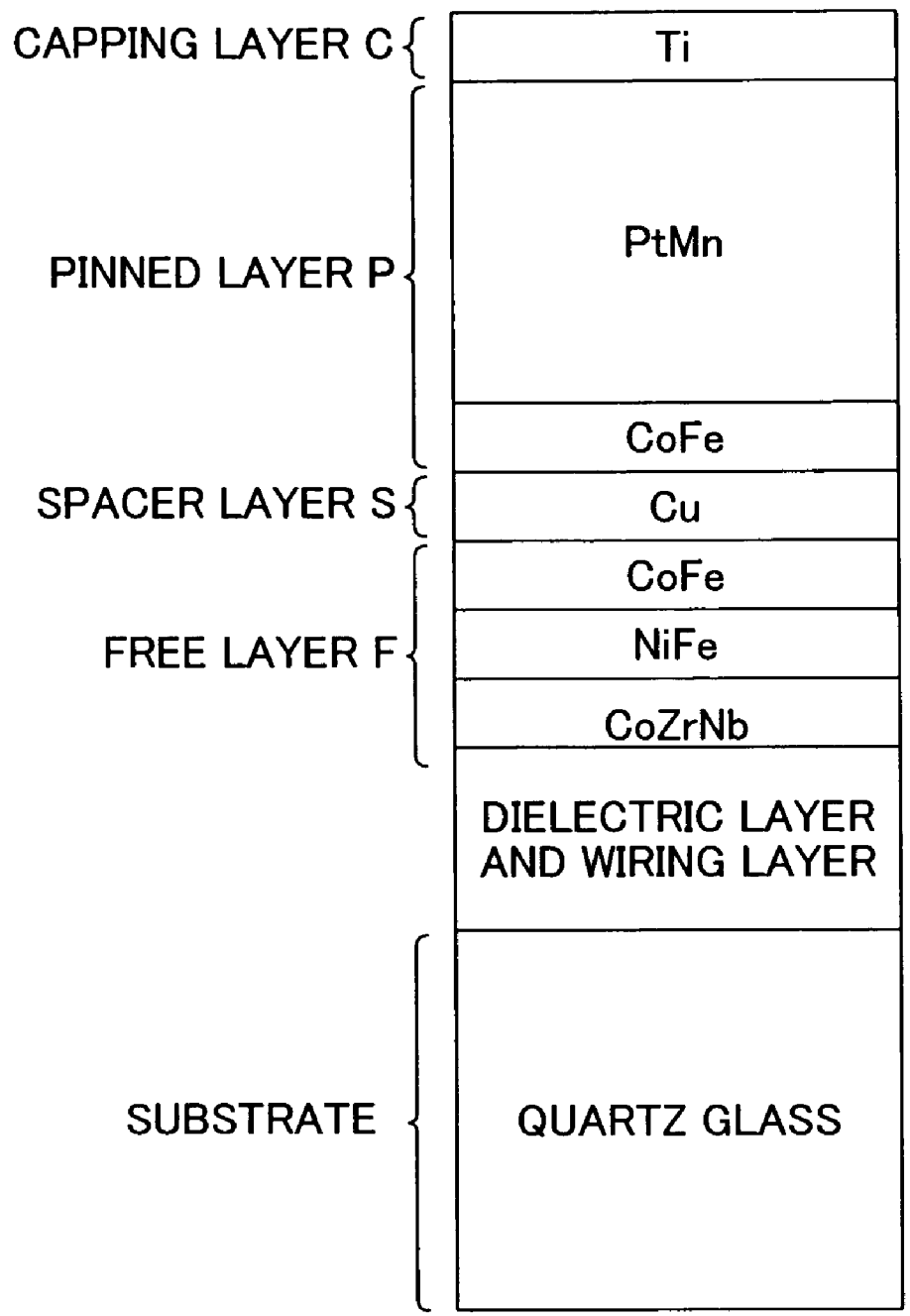
FIG. 42 is a view showing the configuration of a conventional spin valve film.

Next, there was manufactured a magnetic sensor 100 including elements arranged as shown in FIG. 41, each element including the synthetic spin valve film SAF, in a manner similar to that of the above-described embodiment. Also, there was manufactured a magnetic sensor 100' (not shown) including elements arranged in a manner similar to that of the magnetic sensor 100, each element including a conventional spin valve film (having the film configuration shown in FIG. 42).

The magnetic sensor 100 includes GMR elements 111 to 114 and GMR elements 121 to 124. The GMR elements 111 to 114 correspond to the GMR elements 11 to 14, respectively, of the magnetic sensor 10. The GMR elements 121 to 124 correspond to the GMR elements 21 to 24, respectively, of the magnetic sensor 10. FIG. 41 shows the arrangement of the GMR elements 111 to 114 and 121 to 124, magnetization directions of pinned layers, and magnetization directions of free layers in the absence of an external magnetic field.

Figure 43:
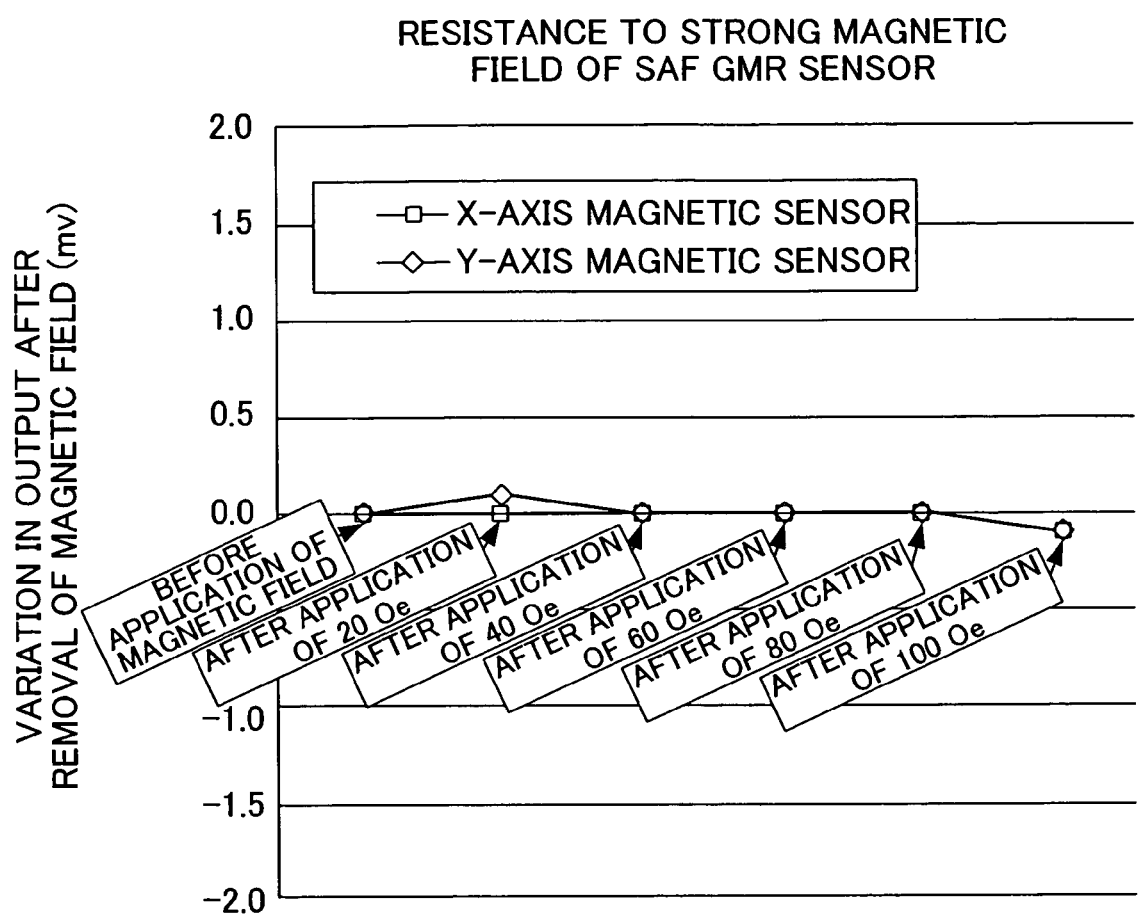
FIG. 43 is a graph showing a variation in output of the magnetic sensor of FIG. 41 as observed after a strong magnetic field is applied thereto.
Figure 44:
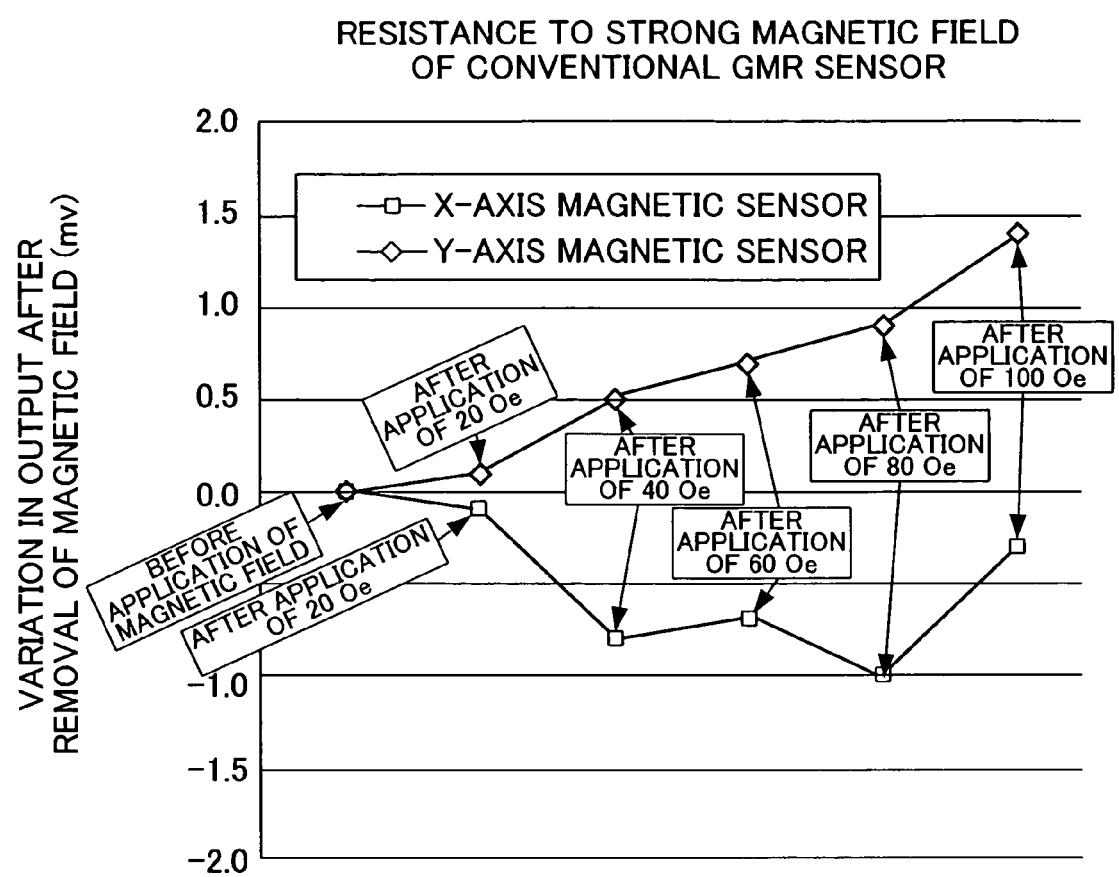
FIG. 44 is a graph showing a variation in output of a conventional magnetic sensor having an element arrangement similar to that of FIG. 41 and employing the spin valve film of FIG. 42, as observed after a strong magnetic field is applied thereto.

A magnetic field having an intensity of 20, 40, 60, 80, and 100 (Oe) was applied to the magnetic sensor 100 and the conventional magnetic sensor 100' in the positive and negative directions of the X-axis by use of a magnetic coil. Subsequently, the applied magnetic field was removed, and the magnetic sensors 100 and 100' were examined for the output voltage of the X- and Y-axis magnetic sensors. The results are shown in FIGS. 43 and 44. As is apparent from comparison between FIGS. 43 and 44, the magnetic sensor 100 according to the present invention hardly exhibits a variation in output after a magnetic field is applied thereto (see FIG. 43). By contrast, the conventional magnetic sensor 100' exhibits a very large variation in output after a magnetic field is applied thereto (see FIG. 44). This indicates that the magnetic sensor 100 according to the present invention is superior to the conventional magnetic sensor 100' in resistance to strong magnetic field.

It should also be noted that the magnetic sensor, described above, is a sensor being formed in such a manner that a plurality of said magnetoresistance effect elements (e.g., GMR elements) are provided in a single plane on a single chip (substrate) having a generally square shape, said magnetoresistance effect elements are placed symmetrically with respect to center lines of said generally square chip, and the pinned layers of at least two of said plurality of magnetoresistance effect elements have the pinned magnetization directions that cross each other (i.e., the pinned magnetization directions cross each other with 90 degrees). Further, it is also noted that the magnetic sensor 10 above includes four said magnetoresistance effect elements constructing a X-axis or a Y-axis magnetic sensor by full bridge connection of the four elements, said pinned magnetization directions of the pinned layers of the four elements being parallel each other.

Embodiments of the present invention have been described with respect to a method for manufacturing a magnetic sensor, a magnet array, and a method for manufacturing the magnet array. However, the present invention is not limited thereto, but may be embodied in many other specific forms without departing from the scope of the invention. For example, when magnetizations of pinned layers are to be pinned in respectively fixed directions by use of the magnet array 50, the films M are not necessarily patterned. The films M may be patterned after magnetizations of pinned layers are pinned in respectively fixed directions.

What is claimed is:

1. A method for manufacturing a magnetic sensor configured in such a manner that at least two giant magnetoresistance elements are disposed on a substrate and that pinned magnetization directions of pinned layers of the giant magnetoresistance elements are substantially perpendicular to each other, each of the giant magnetoresistance elements comprising a fixed layer including a pinned layer and a pinning layer for pinning the magnetization of the pinned layer in a fixed direction; a free layer whose magnetization direction varies in accordance with an external magnetic field; and a spacer layer disposed between the pinned layer and the free layer and made of a nonmagnetic electric conductor, wherein the fixed layer is a multifilm laminated fixed layer configured such that the pinned layer comprises a first ferromagnetic film adjacent to the spacer layer, a second ferromagnetic film laminated on the first ferromagnetic film, and an exchange-coupling film sandwiched between the first ferromagnetic film and the second ferromagnetic film;

the pinning layer comprises an exchange bias film made of antiferromagnet, disposed adjacent to the second ferromagnetic film on a side opposite the exchange-coupling film, and adapted to pin magnetization of the second ferromagnetic film in a fixed direction through exchange-coupling with the second ferromagnetic film; and the first ferromagnetic film and the second ferromagnetic film are exchange-coupled to each other via the exchange-coupling film;

the method comprising the steps of:

preparing a magnet array comprising a plurality of permanent magnets and a thin-plate yoke made of a magnetic material, each permanent magnet having a shape of a substantially rectangular parallelepiped, the rectangular parallelepiped having a cross section in a substantially square shape taken perpendicular to its axis, and each permanent magnet having magnetic poles generated on its corresponding opposite end surfaces having the substantially square shape perpendicular to the axis;

the plurality of permanent magnets being arranged in such a manner that a centroid of each of the substantially square end surfaces thereof coincides with a lattice point of a tetragonal lattice, that the permanent magnets arranged on the same lattice line of the tetragonal lattice are such that one side of the end surface of a certain permanent magnet is substantially aligned with one side of the end surface of another permanent magnet, that the end surfaces of the plurality of permanent magnets are present substantially on the same plane, and that magnetic poles generated on the end surfaces of two adjacent, closest permanent magnets differ in polarity; and the yoke having a plurality of through holes arranged in substantially the same manner as the arranged permanent magnets, each through hole comprising a square portion having a shape substantially identical with the substantially square shape of the cross section of the permanent magnet, and rectangular portions each being formed along a central portion of a side of the square portion and having the central portion as its long side; the plurality of permanent magnets being inserted through the corresponding square portions of the plurality of through holes; and a plane in which the end surfaces of the plurality of permanent magnets are present is located between an upper surface and a lower surface of the yoke;

manufacturing a wafer in which element films each including a film to become the fixed layer, a film to become the spacer layer, and a film to become the free layer are formed on the substrate; and simultaneously pinning the magnetization directions of the films to become the fixed layers in the element films formed on the wafer, by means of disposing the wafer in the proximity of the magnet array in such a manner that a plane of the wafer is in parallel with a plane of the yoke, to thereby apply magnetic fields generated in the vicinity of the rectangular portions of the yoke to the wafer, and holding the wafer at high temperature.

2. A magnet array comprising a plurality of permanent magnets and a thin-plate yoke made of a magnetic material, each permanent magnet having a shape of a substantially rectangular parallelepiped, the rectangular parallelepiped having a cross section in a substantially square shape taken perpendicular to its axis, and each permanent magnet having magnetic poles generated on its corresponding opposite end surfaces having the substantially square shape perpendicular to the axis;

the plurality of permanent magnets being arranged in such a manner that a centroid of each of the substantially square end surfaces thereof coincides with a lattice point of a tetragonal lattice, that the permanent magnets arranged on the same lattice line of the tetragonal lattice are such that one side of the end surface of a certain permanent magnet is substantially aligned with one side of the end surface of another permanent magnet, that the end surfaces of the plurality of permanent magnets are present substantially on the same plane, and that magnetic poles generated on the end surfaces of two adjacent, closest permanent magnets differ in polarity; and the yoke having a plurality of through holes arranged in substantially the same manner as the arranged permanent magnets, each through hole comprising a square portion having a shape substantially identical with the substantially square shape of the cross section of the permanent magnet, and rectangular portions each being formed along a central portion of a side of the square portion and having the central portion as its long side; the plurality of permanent magnets being inserted through the corresponding square portions of the plurality of through holes; and a plane in which the end surfaces of the plurality of permanent magnets are present is located between an upper surface and a lower surface of the yoke.

3. A magnet array according to claim 2, wherein, in the yoke of the magnet array as viewed in plane, openings are formed in such a manner that each of the openings surrounds a centroid of square formed by connecting adjacent lattice points of the tetragonal lattice.

4. A magnet array according to claim 2, wherein, as viewed in plane, each of the through holes of the yoke has marginal portions which have a substantially circular arc shape and are formed at corresponding corners of the square portion of the through hole in such a manner as to expand outward.

5. A magnet array according to claim 3, wherein, as viewed in plane, each of the through holes of the yoke has marginal portions which have a substantially circular arc shape and are formed at corresponding corners of the square portion of the through hole in such a manner as to expand outward.

6. A method for manufacturing a magnet array comprising an array substrate formed of a thin plate, a plurality of permanent magnets arrayed on the array substrate, and a yoke disposed at upper portions of the plurality of permanent magnets and formed of a thin plate of a magnetic material, the method comprising the steps of:

preparing the array substrate by means of forming a plurality of grooves in the thin plate in a predetermined tetragonal lattice array, each of the grooves having a predetermined depth and a square shape substantially identical in shape with an end face of the permanent magnet;

preparing the yoke by means of forming a plurality of through holes in the thin plate of the magnetic material in the predetermined tetragonal lattice array, each of the through holes comprising a square portion having a square shape substantially identical in shape with the groove of the array substrate and rectangular portions each being formed along a central portion of a side of the square portion and having the central portion as its long side;

arranging each of spacers on the array substrate between two adjacent parallel lines of the grooves;

placing the yoke on the spacers in such a manner that, as viewed in plane, the plurality of grooves of the array substrate are aligned with the corresponding through holes of the yoke;

inserting the plurality of permanent magnets each having a shape of a substantially rectangular parallelepiped, the rectangular parallelepiped having a cross section in a square shape taken perpendicular to its axis, the square shape being substantially identical in shape with the groove of the array substrate and with the square portion of the through hole of the yoke, each permanent magnet having magnetic poles generated on its corresponding opposite end surfaces having the square shape, into the corresponding grooves of the array substrate through the corresponding through holes of the yoke in such a manner that lower end surfaces of the permanent magnets abut corresponding bottom surfaces of the grooves;

raising the yoke until a plane in which upper end surfaces of the permanent magnets are present is positioned between upper and lower surfaces of the yoke; and removing the spacers.

7. A method for manufacturing a magnet array according to claim 6, wherein the step of preparing the yoke includes a step of forming openings in the thin plate at positions where, as viewed in plane, centroids of squares formed by connecting lattice points of the tetragonal lattice are located.

8. A method for manufacturing a magnet array according to claim 7, wherein in the step of raising the yoke, the yoke is raised by means of holding the yoke at the openings with a tool.

* * * * *